US010725254B2

(12) United States Patent
Shastri et al.

(10) Patent No.: US 10,725,254 B2
(45) Date of Patent: Jul. 28, 2020

(54) HIGH DENSITY OPTO-ELECTRONIC INTERCONNECTION CONFIGURATION UTILIZING PASSIVE ALIGNMENT

(71) Applicant: Aayuna Inc., Allentown, PA (US)

(72) Inventors: Kalpendu Shastri, Orefield, PA (US); Anujit Shastri, San Francisco, CA (US); Soham Pathak, Allentown, PA (US); Bipin Dama, Bridgewater, NJ (US); Alan Leonhartsberger, Kempton, PA (US); Rao Yelamarty, Allentown, PA (US)

(73) Assignee: Aayuna Inc., Allentown, PA (US)

( * ) Notice: Subject to any disclaimer, the term of this patent is extended or adjusted under 35 U.S.C. 154(b) by 125 days.

(21) Appl. No.: 16/135,423

(22) Filed: Sep. 19, 2018

(65) Prior Publication Data

US 2019/0086618 A1 Mar. 21, 2019

Related U.S. Application Data

(60) Provisional application No. 62/560,859, filed on Sep. 20, 2017, provisional application No. 62/568,013, (Continued)

(51) Int. Cl.
G02B 6/42 (2006.01)
H01R 12/72 (2011.01)
H01S 5/40 (2006.01)
H01S 5/022 (2006.01)
H01S 5/024 (2006.01)
G02B 6/43 (2006.01)

(52) U.S. Cl.
CPC .......... *G02B 6/423* (2013.01); *G02B 6/4204* (2013.01); *G02B 6/428* (2013.01); *G02B 6/4212* (2013.01); *G02B 6/4249* (2013.01); *G02B 6/4261* (2013.01); *G02B 6/4268* (2013.01); *G02B 6/4269* (2013.01); *G02B 6/43* (2013.01); *H01R 12/721* (2013.01); *H01S 5/02252* (2013.01); *H01S 5/02469* (2013.01); *H01S 5/4025* (2013.01); *G02B 6/4208* (2013.01); *G02B 6/4216* (2013.01); *H01S 5/02276* (2013.01); *H01S 5/02284* (2013.01)

(58) Field of Classification Search
CPC .... G02B 6/423; G02B 6/4204; G02B 6/4212; G02B 6/4249; G02B 6/4261; G02B 6/4268

See application file for complete search history.

(56) References Cited

U.S. PATENT DOCUMENTS 6,325,552 B1 12/2001 Brillhart
6,491,446 B1 12/2002 Kryzak
(Continued)

*Primary Examiner* — Sung H Pak
*Assistant Examiner* — Hoang Q Tran
(74) *Attorney, Agent, or Firm* — Wendy W. Koba

(57) ABSTRACT

A high density interconnect arrangement takes the form of a backplane-pluggable card, with electrical connections formed along a single (pluggable) edge and all remaining connections provided via optical fibers. An exemplary interconnect arrangement also includes on-board optical sources and silicon photonic-based circuitry for providing optical transceiver functionality. Passively aligned fiber arrays are utilized to provide I/O connections to external elements, as well as between laser sources and on-board silicon photonics.

17 Claims, 27 Drawing Sheets

Related U.S. Application Data filed on Oct. 4, 2017, provisional application No. 62/568,362, filed on Oct. 5, 2017, provisional application No. 62/658,668, filed on Apr. 17, 2018.

(56) References Cited

U.S. PATENT DOCUMENTS

| | | |
|---|---|---|
| 6,754,406 B2 | 6/2004 | Kaneshiro et al. |
| 7,215,845 B1 | 5/2007 | Chan et al. |
| 8,348,516 B2 | 1/2013 | Roth |
| 8,364,042 B2 | 1/2013 | Shastri et al. |
| 8,998,509 B2 * | 4/2015 | Thacker ............... G02B 6/4284 385/14 |
| 9,235,018 B2 | 1/2016 | McColloch |
| 9,575,267 B1 | 2/2017 | Shastri et al. |
| 9,651,752 B2 | 5/2017 | Zbinden et al. |
| 9,995,881 B1 * | 6/2018 | Patel ...................... G02B 6/423 |
| 2005/0147416 A1 | 7/2005 | Mader et al. |
| 2015/0016784 A1 | 1/2015 | Shastri et al. |
| 2016/0156999 A1 | 6/2016 | Liboiron-Ladouceur et al. |
| 2016/0161685 A1 | 6/2016 | Xu et al. |
| 2017/0019168 A1 | 1/2017 | Menard et al. |
| 2018/0146270 A1 | 5/2018 | Jiang |
| 2018/0164520 A1 | 6/2018 | Epitaux et al. |

* cited by examiner

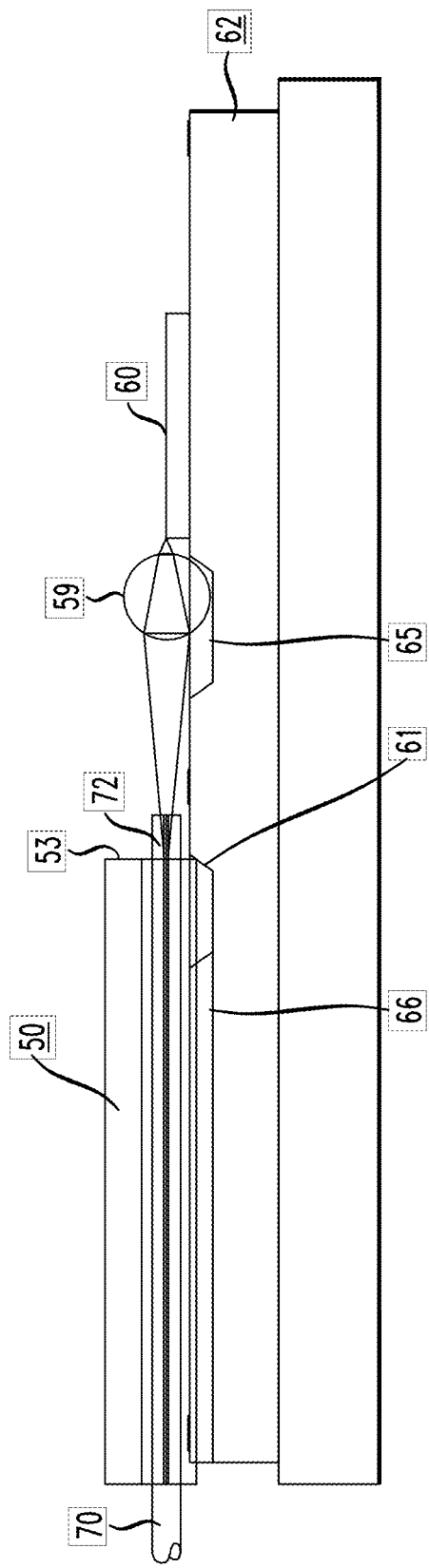
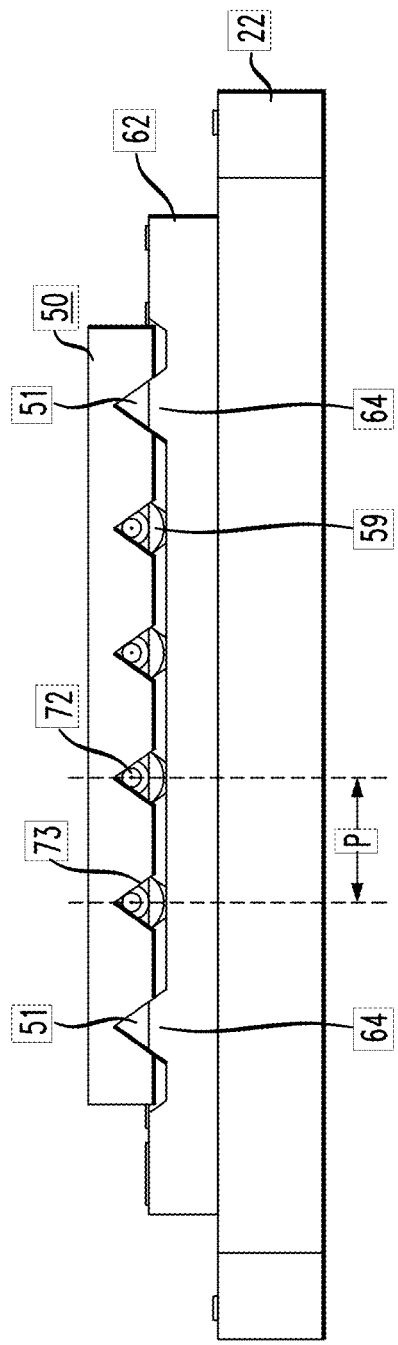

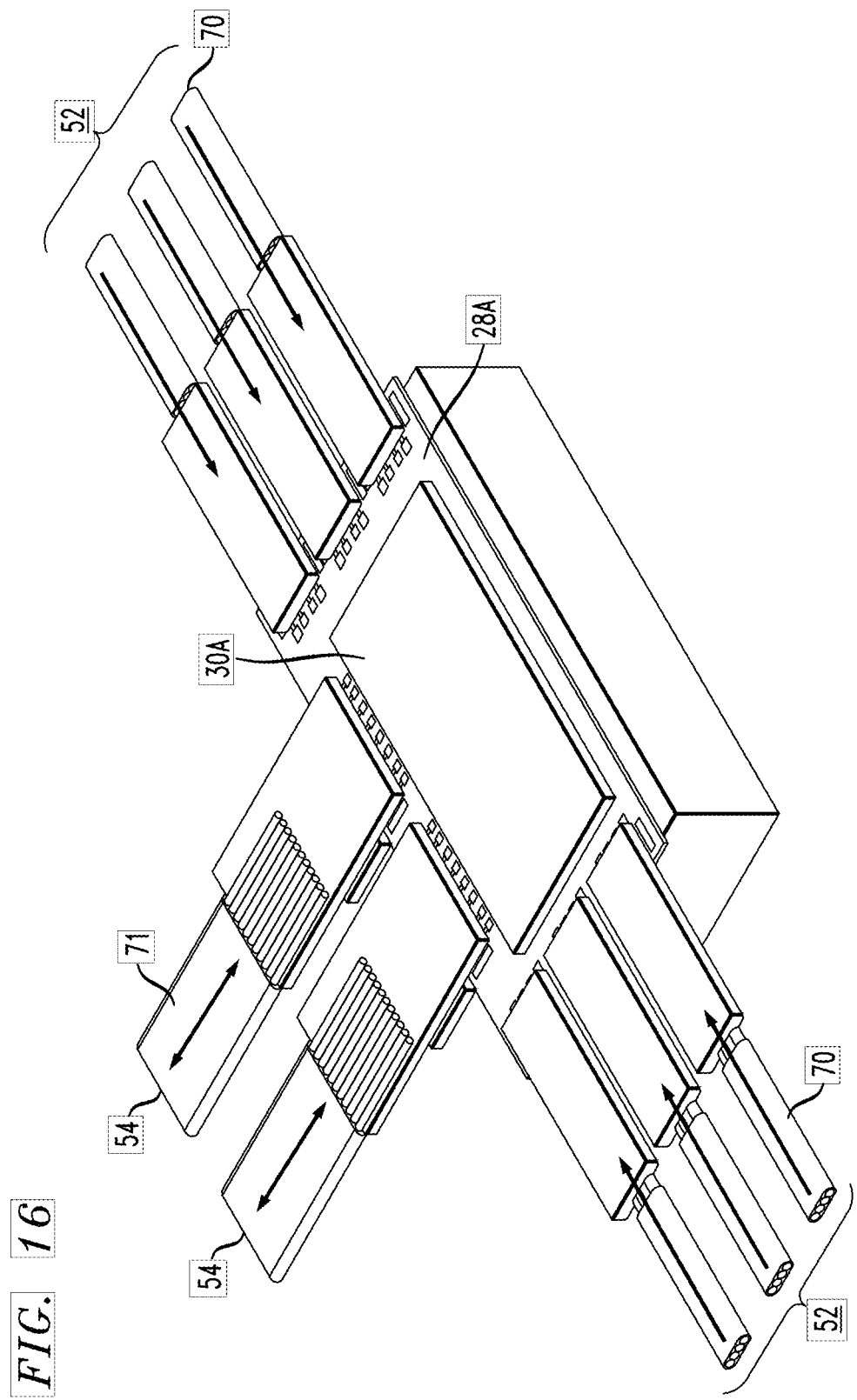

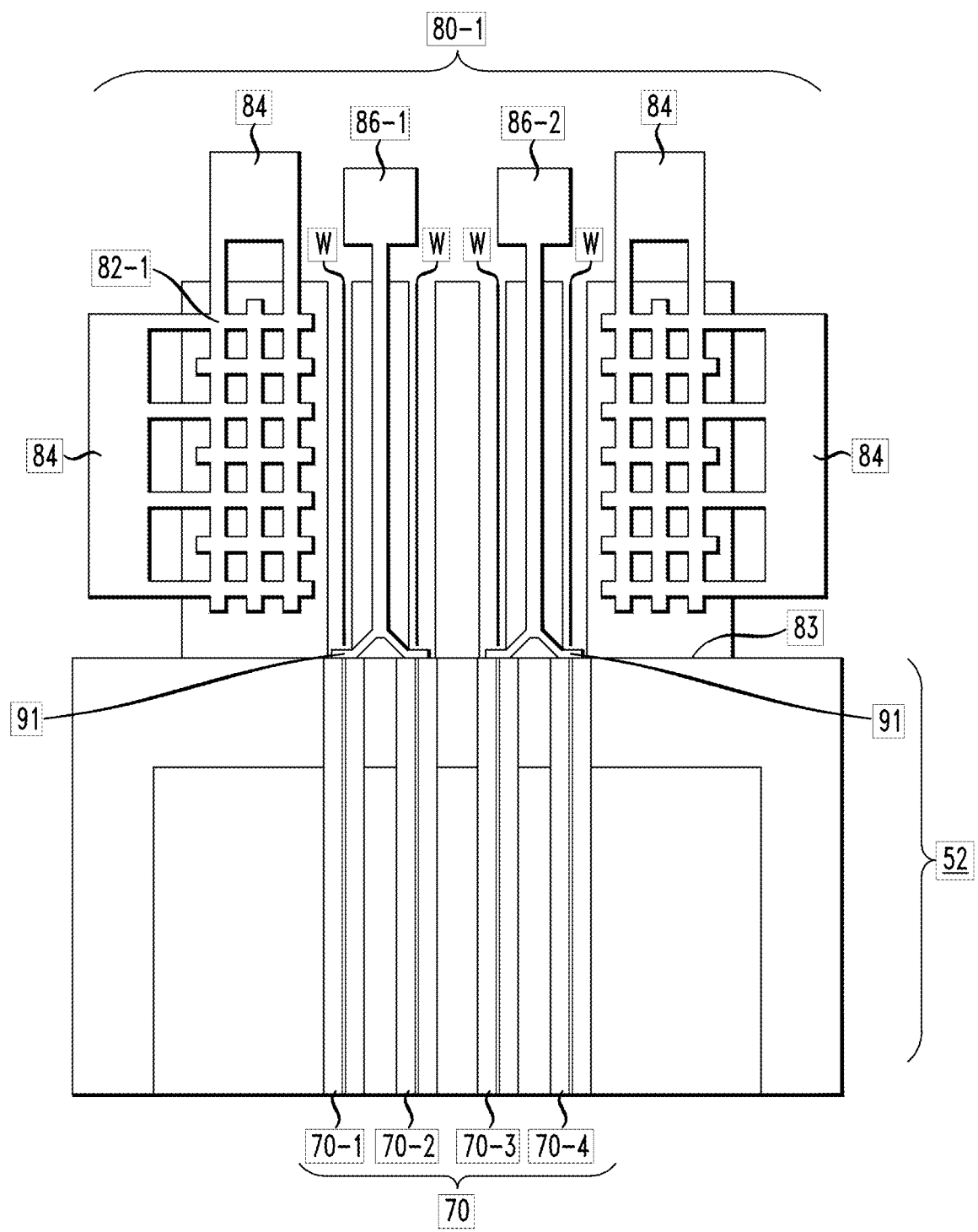

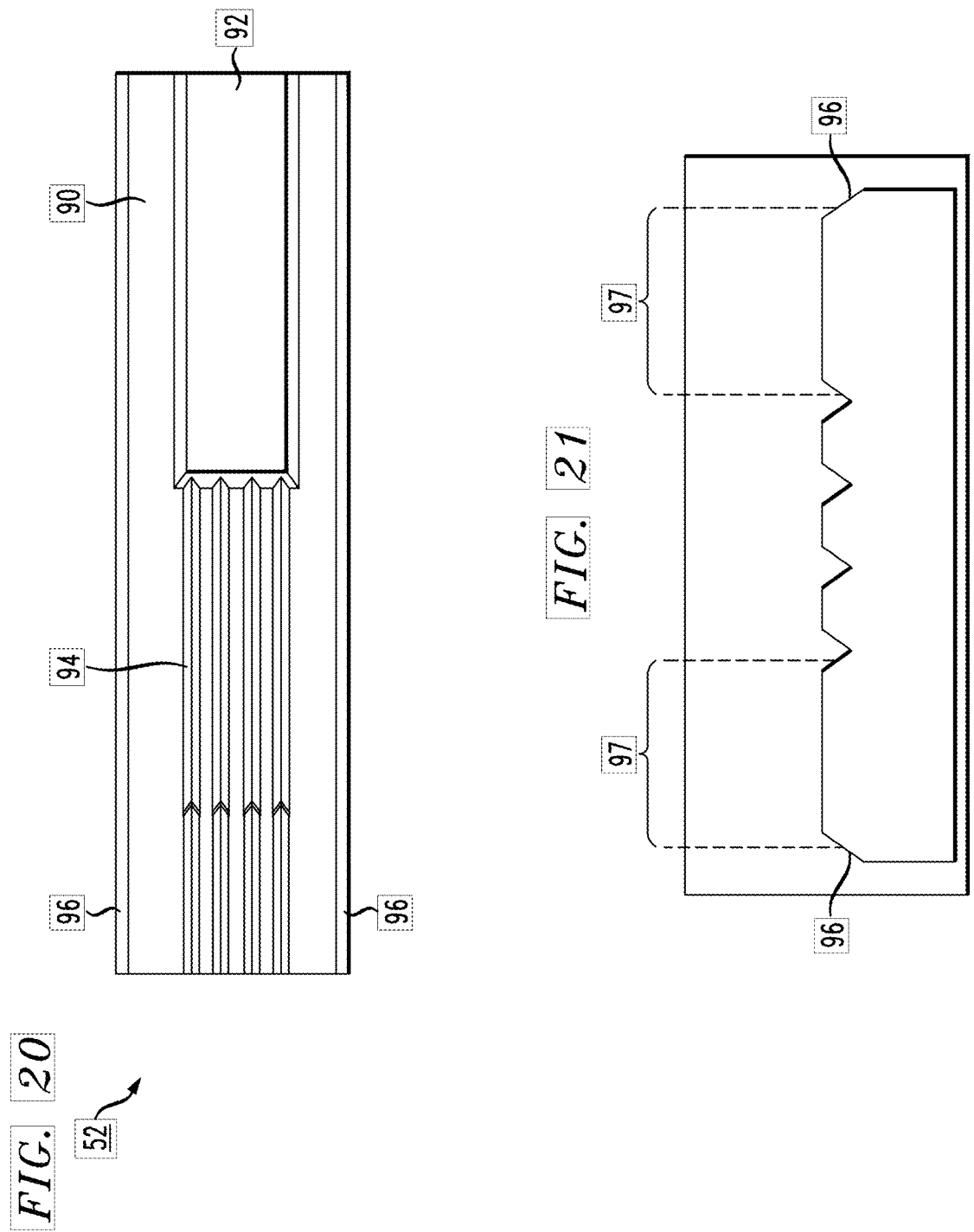

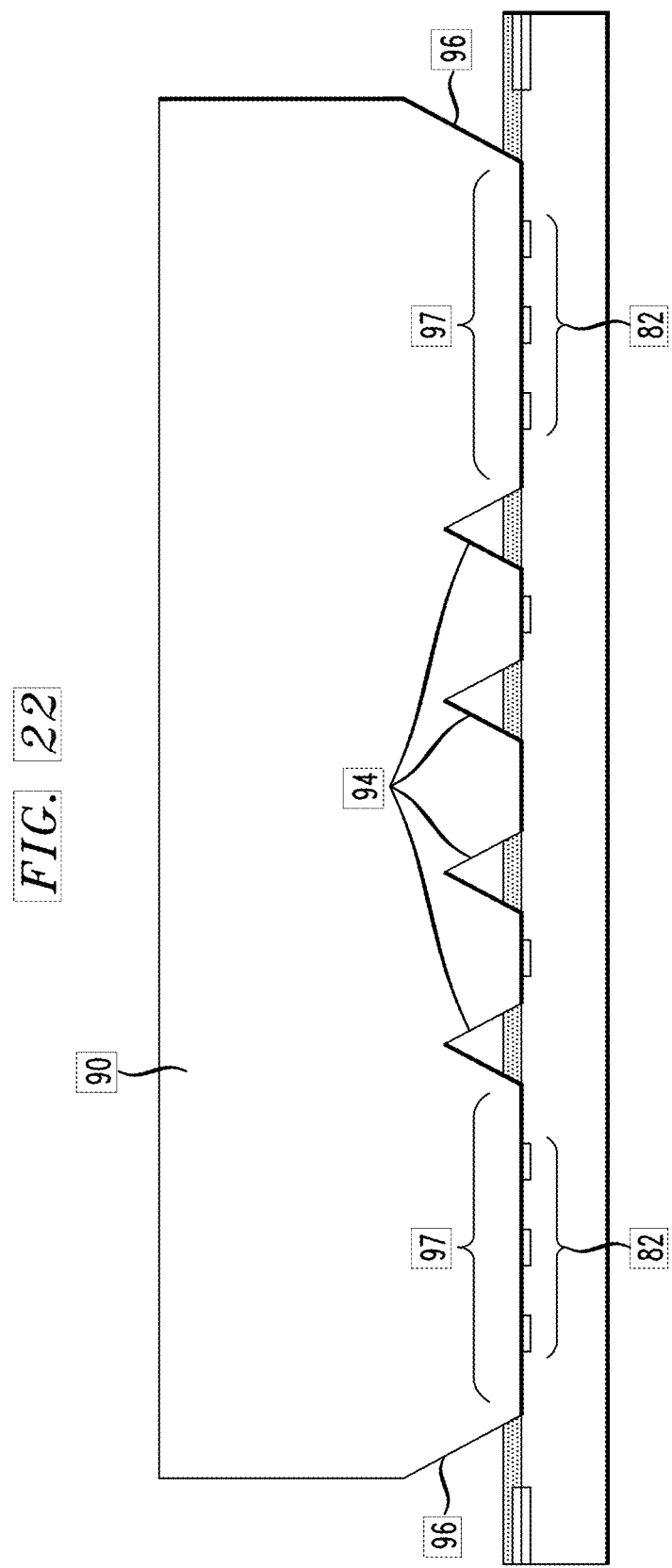

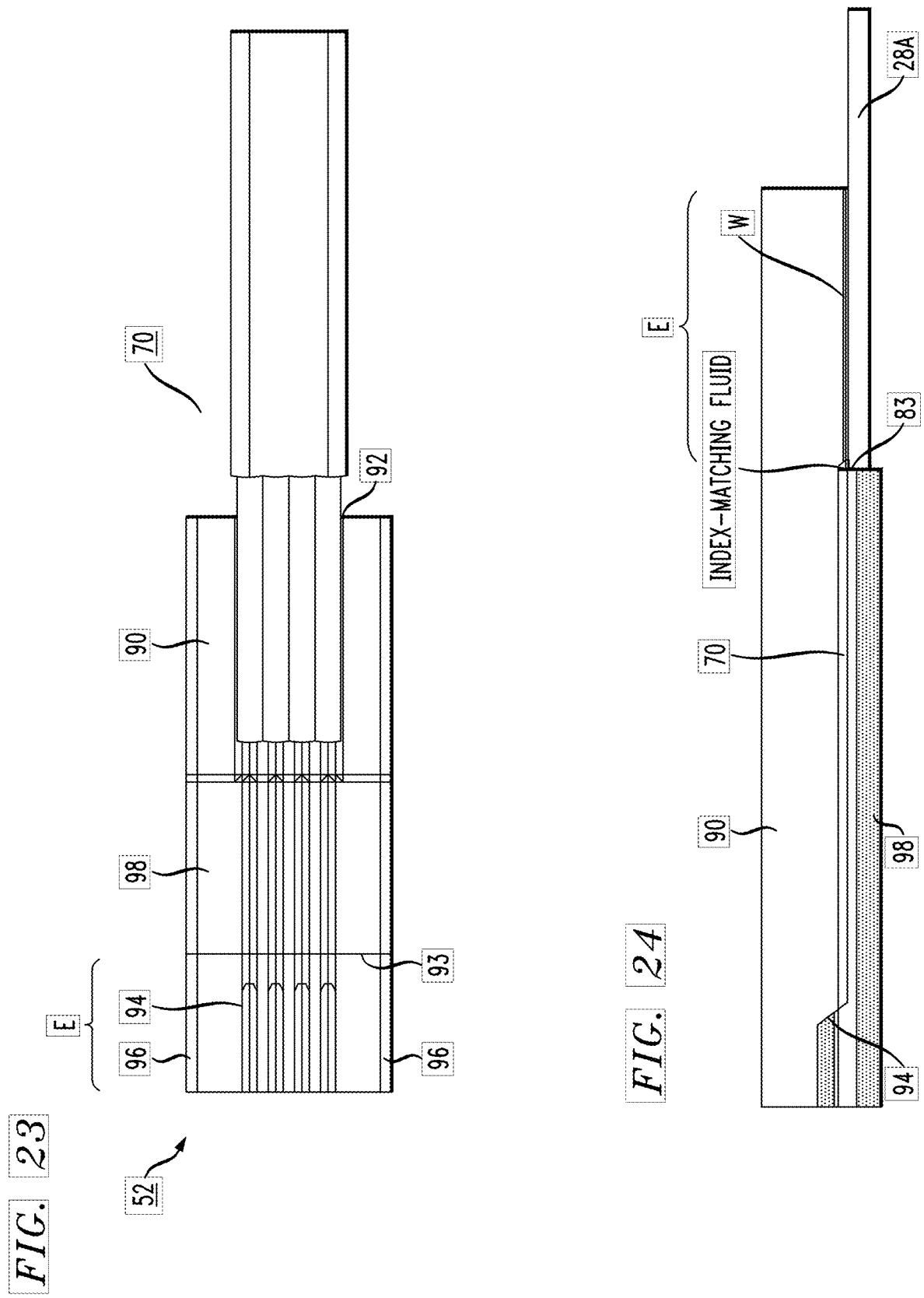

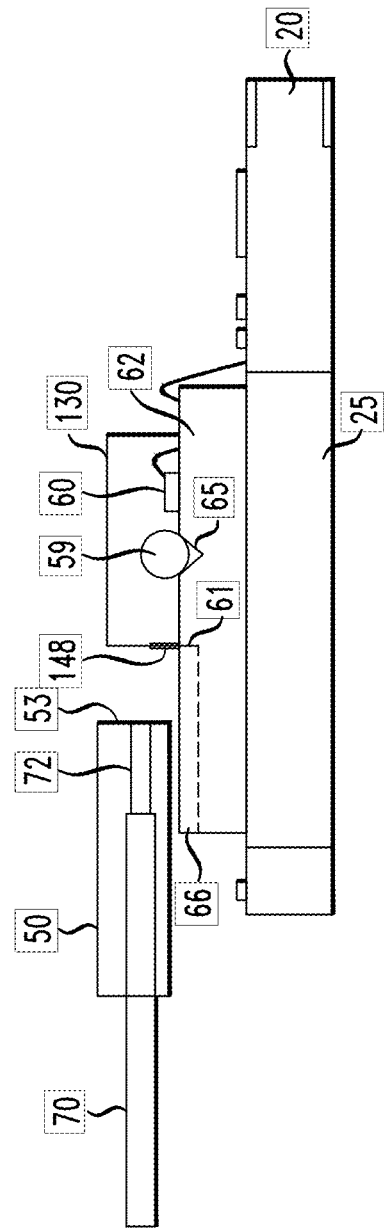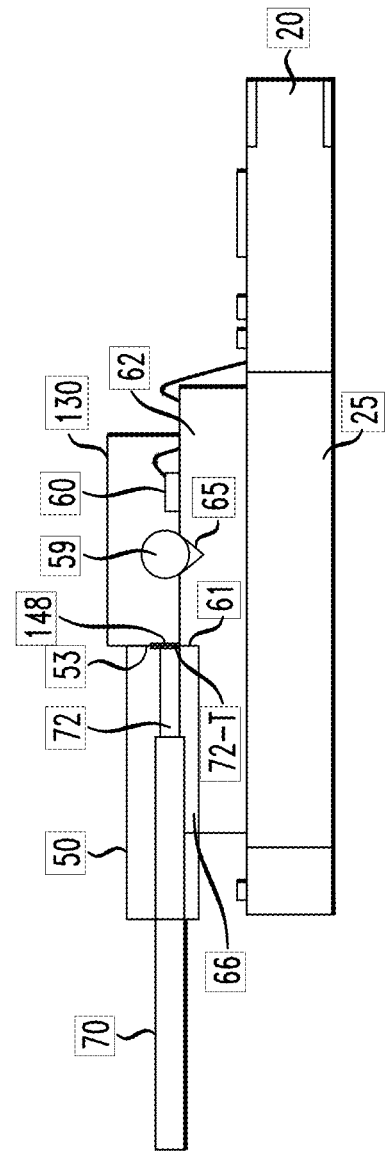

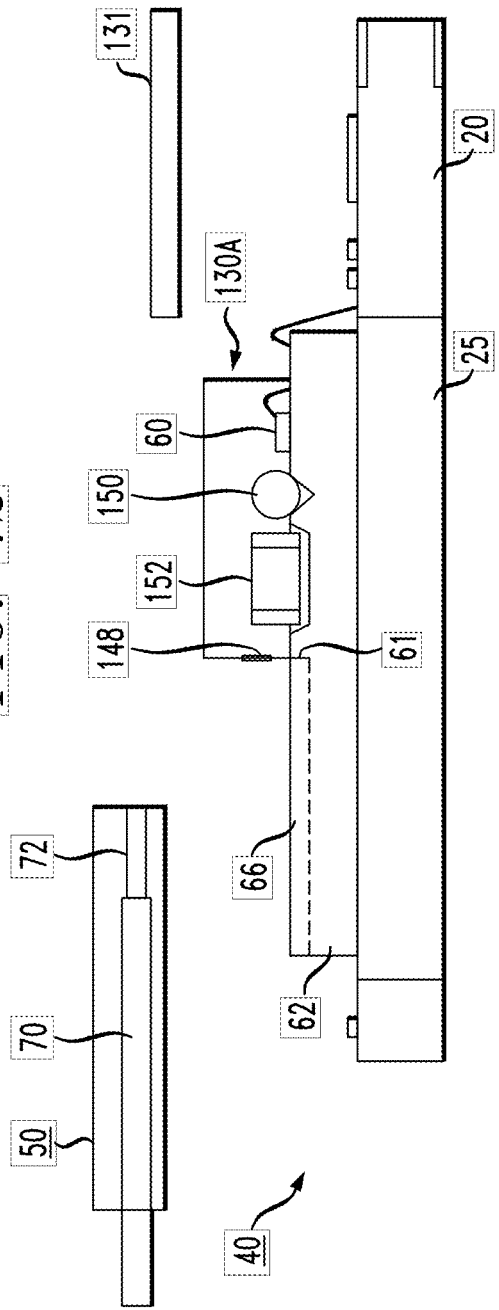
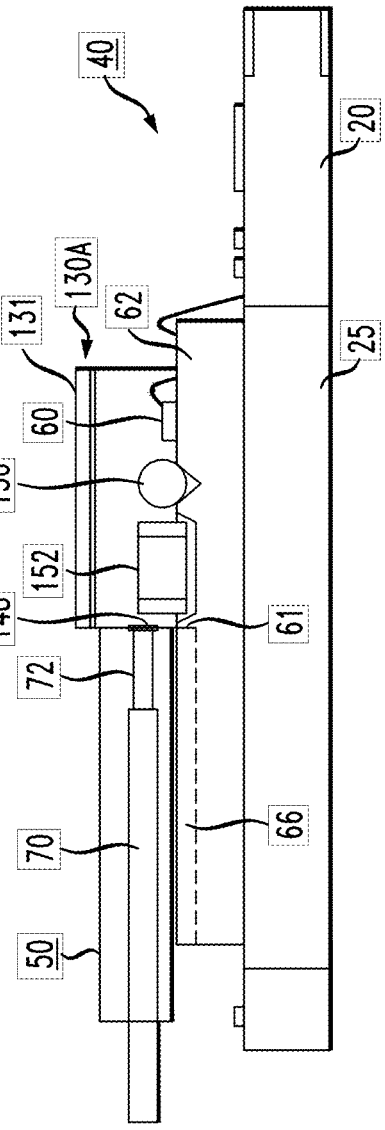

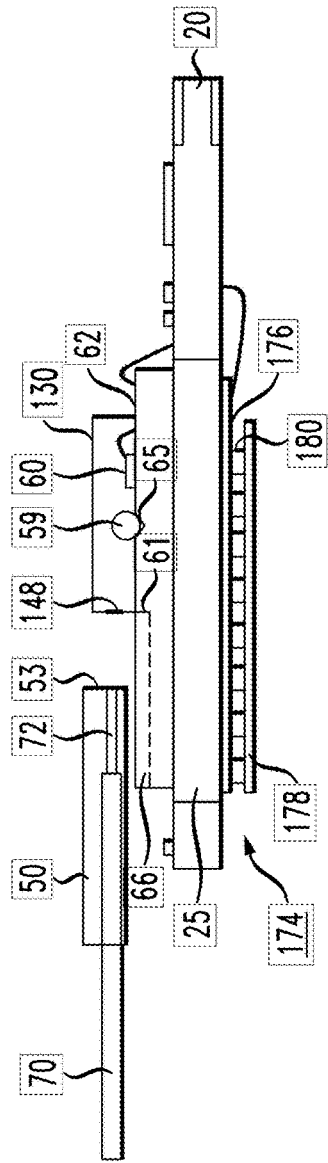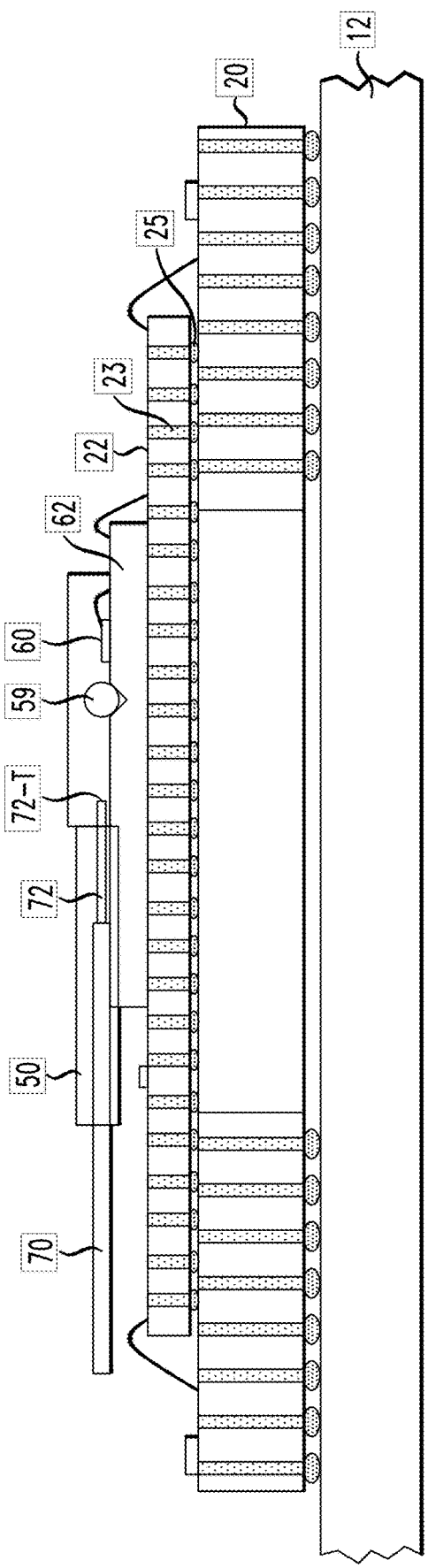

HIGH DENSITY OPTO-ELECTRONIC INTERCONNECTION CONFIGURATION UTILIZING PASSIVE ALIGNMENT

CROSS-REFERENCE TO RELATED APPLICATIONS

This application claims the benefit of the following applications: U.S. Provisional Application No. 62/560,859, filed Sep. 20, 2017; U.S. Provisional Application No. 62/568,013, filed Oct. 4, 2017; U.S. Provisional Application No. 62/568,362, filed Oct. 5, 2017, and U.S. Provisional Application No. 62/658,668, filed Apr. 17, 2018, the contents of all provisional applications hereby incorporated by reference.

TECHNICAL FIELD

The present invention relates to an interconnection configuration for optical communication systems and, more particularly, to a high density, high bandwidth interconnection configuration utilizing the advantages of 2.5/3D packaging and silicon photonics to create a backplane connectable arrangement utilizing passive optical alignment between optical fibers and the associated components.

BACKGROUND OF THE INVENTION

The next generation high performance opto-electronic systems are known to need about a ten-fold increase in interconnection bandwidth about every four years. Against this increase in demand are the requirements to maintain cost, power and space as minimal as possible. Moore's Law and the newer 2.5D/3D IC packaging technologies have enabled a degree of integration advances sufficient to address most of the interconnection bandwidth concerns. However, this improvement has been achieved at an extremely high cost, and often with high power demands and/or the need for relatively large-sized configurations for all of the requisite electrical and optical interconnections.

While advances in silicon photonics is expected to play a key role in addressing some of these goals, inasmuch as it allows for integration to keep pace with Moore's Law and minimizes some costs by taking advantage of well-known IC fabrication techniques, there remains many concerns regarding optimum configurations for packaging these interconnection components, particularly configurations scalable with proposed large numbers of high bandwidth interconnects for next generation systems.

SUMMARY OF THE INVENTION

The needs remaining in the prior art are addressed by the present invention, which relates to an interconnection configuration for optical communication systems and, more particularly, to a high density, high bandwidth interconnection card utilizing the advantages of 2.5/3D packaging to create a backplane connectable arrangement capable of supporting an optical I/O bandwidth of 19.2-76.8 Tb/s in each direction.

In accordance with one or more embodiments of the present invention, a high density interconnect arrangement takes the form of a backplane-pluggable card, with electrical connections formed along a single (pluggable) edge and all remaining connections provided via optical fibers. An exemplary interconnect arrangement also includes on-board optical sources and silicon photonic-based circuitry for providing optical transceiver functionality. Passively aligned fiber arrays are utilized to provide I/O connections to external elements, as well as between laser sources and on-board silicon photonics.

A specific embodiment of the present invention takes the form of an interconnection card including a card substrate, an electrical edge connector formed along a first end termination of the card substrate, an optical connector formed along an opposing, second end termination of the card substrate, electrical routing and switching circuitry disposed on the card substrate, a package substrate disposed on the card substrate, a silicon photonic integrated circuit (PIC) disposed on the package substrate and used to provide conversion between optical input signals and electrical output signals (the silicon PIC formed to include alignment channels around selected peripheral locations and etch regions for holding bonding material), at least one laser transmitter module disposed on the card substrate (the laser transmitter module including a silicon submount upon which an array of laser diodes is located, the silicon submount patterned and etched to form alignment rails) and a plurality of passively-aligned optical fiber array connectors coupled between the at least one laser transmitter module and the silicon PIC. The plurality of passively-aligned optical fiber array connectors itself includes a first fiber array connector disposed in alignment with an array of laser diodes within the at least one laser transmitter module (the first fiber array connector including a silicon substrate patterned and etched to form fiber-holding V-grooves and alignment trenches for mating with the silicon submount alignment rails to provide passive alignment between an array of optical fibers and the laser diode array), a second fiber array connector disposed in alignment with an array of optical waveguides formed within a portion of the silicon PIC and terminating along an endface (the second fiber array connector including a silicon substrate patterned and etched to form fiber-holding V-grooves and alignment rails for mating with the alignment channels formed in the silicon PIC), wherein a first array of optical fibers is disposed between the first fiber array connector and the second fiber array connector to provide optical communication between the at least one laser transmitter module and the silicon PIC; and a third fiber array connector disposed in alignment with an array of optical waveguides formed within a separation portion of the silicon PIC and terminating along an endface, the third fiber array connector including a silicon substrate patterned and etched to form fiber-holding V-grooves and alignment rails for mating with selected alignment channels formed in the silicon PIC, wherein a second array of optical fibers is disposed between the third fiber array connector and the optical connector positioned on the interconnection card, to provide optical communication into and out of the interconnection card.

Other and further aspects and principles of the present invention will become apparent during the course of the following discussion and by reference to the accompanying drawings.

BRIEF DESCRIPTION OF DRAWINGS

Referring now to the drawings, where like numerals represent like parts in several views:

FIG. 14 is a cut-away view of a first fiber connector array in combination with a laser transmitter module;

FIG. 15 is a cut-away side view of the configuration of FIG. 14;

FIG. 16 is an isometric view of an exemplary silicon photonic integrated circuit (PIC) and associated fiber array connectors, the fiber array connectors passively aligned with the silicon substrate portion of the silicon PIC;

FIG. 19 is a top view of the same portion of silicon substrate as shown in FIG. 18, with a second fiber array connector illustrated in alignment with the waveguides formed within the silicon PIC;

FIG. 20 is a top view of a silicon substrate used in the formation of the second fiber array connector, illustrating the trenches and alignment rails formed within its structure;

FIG. 21 is an end view of the silicon substrate of FIG. 20, illustrating the formation of beveled edges used in the formation of alignment rails;

FIG. 22 is a cut-away end view of the silicon substrate portion of the second fiber array connector disposed in alignment with the channels formed in the silicon PIC;

FIG. 23 is a top view of the second fiber array connector, illustrating a cover plate used to define axial separation between the fibers and waveguides;

FIG. 24 is a cut-away side view of the second fiber array connector disposed in place over and in contact with the silicon PIC, illustrating the location of the cover plate against the silicon PIC;

FIG. 38 is a side view of an exemplary laser transmitter module, illustrating the inclusion of a metallic insert for heat transfer;

FIG. 39 shows the same laser transmitter module as illustrated in FIG. 38, in this case with an associated first fiber array connector disposed in aligned position with the laser diode array;

FIG. 42 illustrates yet another embodiment of a laser transmitter module formed in accordance with the present invention, in this case including an isolator element within the laser transmitter module;

FIG. 43 shows the same laser transmitter module as illustrated in FIG. 42, in this case with first fiber array connector disposed in alignment with the laser transmitter module;

FIG. 44 illustrates an exemplary laser transmitter module formed in accordance with the principles of the present invention, in this case including a thermo-electric cooler (TEC) for use in managing the operating temperature of the laser diode array;

FIG. 45 illustrates an exemplary configuration of a laser transmitter module, formed to include a silicon interposer providing electrical signal paths between the laser transmitter module and other components disposed on the interconnection card;

DETAILED DESCRIPTION

Figure 1:
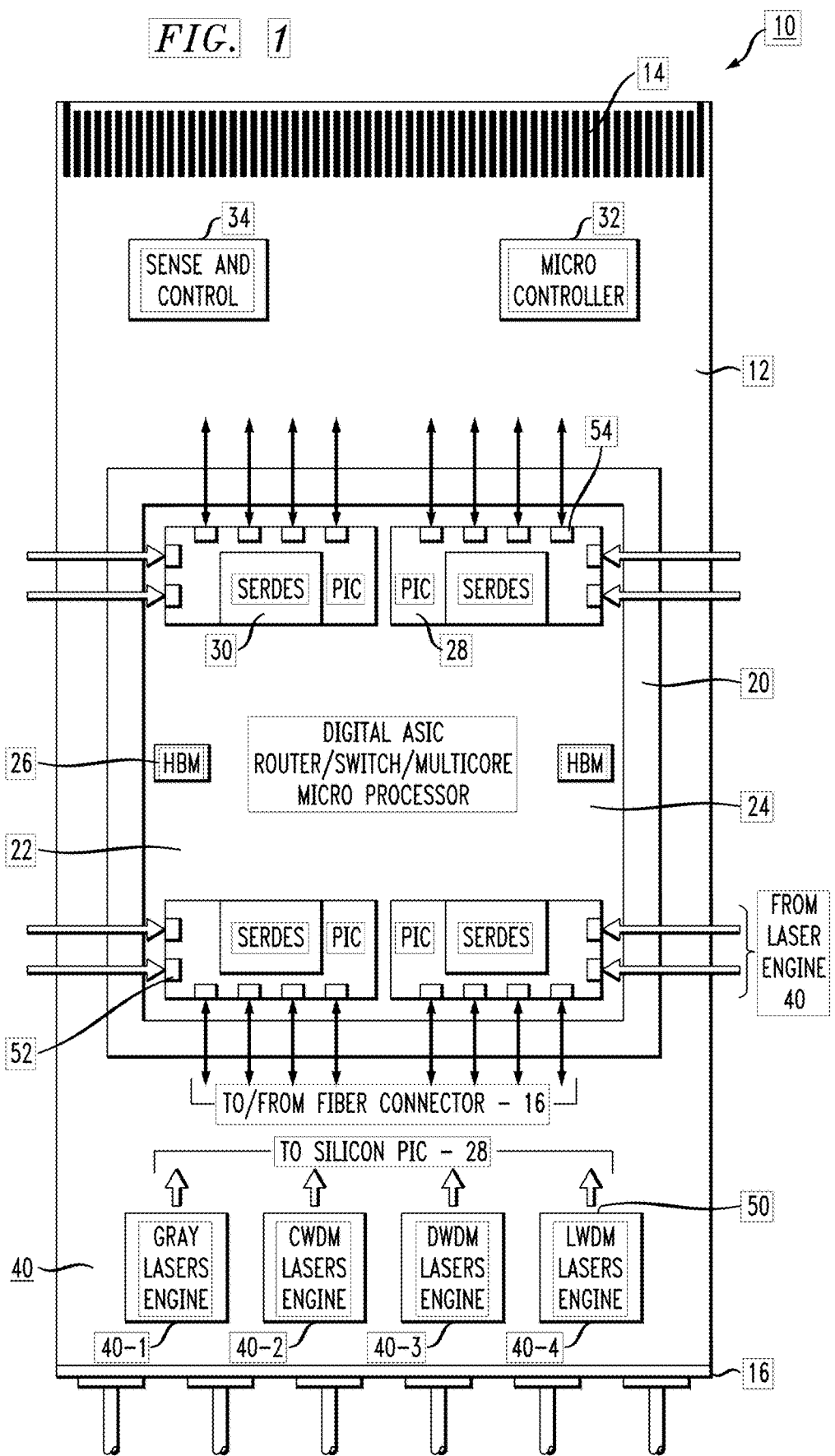
FIG. 1 is a top view of an exemplary interconnection card formed in accordance with the principles of the present invention.

FIG. 1 is a diagrammatic top view of an exemplary high performance, high speed interconnection configuration 10 formed in accordance with one or more embodiments of the present invention.

Figure 2:
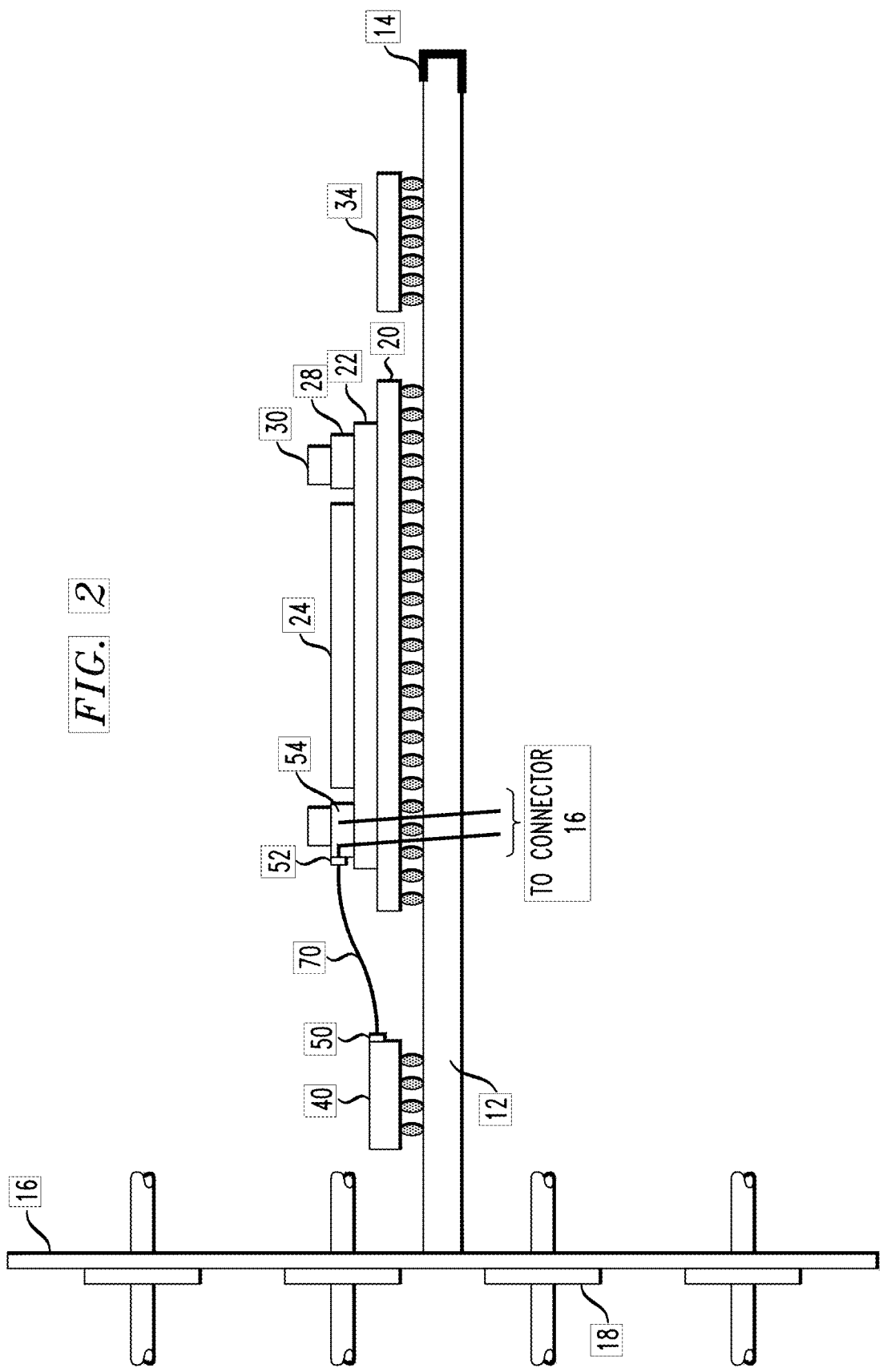
FIG. 2 is a side view of the interconnection card of FIG. 1, illustrating in particular the orientation of the optical fiber connector with respect to the card.

Configuration 10 takes the form of a backplane-pluggable card formed on a substrate 12 (for example, a PCB, so variously referred to at times hereinafter as "PCB 12"). FIG. 1 is a top view of interconnection configuration 10 (hereinafter referred to as "interconnection card 10", or simply "card 10"), showing an electrical edge connector 14 formed at a first end termination of substrate 12, and an optical fiber connector 16 formed at a second, opposing end termination of substrate 12. In this particular embodiment of the present invention, the only electrical connection into or out of card 10 is provided via connectors 14; the remainder of the signal paths into and out of card 10 are optical signal paths in the form of optical fibers. FIG. 2 is a side view of configuration 10, particularly illustrating the relationship between optical fiber connector 16 and substrate 12.

Interconnection card 10 is also shown as supporting various integrated circuit components (both electrical and opto-electronic) assembled on a package substrate 20 (formed of a ceramic or PCB, for example), which is itself disposed on and electrically connected to PCB 12. In most cases, an interposer connection element 22 is disposed directly on package substrate 20, where interposer 22 is formed to include specific electrical connection paths (e.g., through-silicon-vias (TSVs), surface metallizations, or the like) required for electrical connections to/from electrical connector 14, as well as for intra-board connections as described in detail below. The components assembled on package substrate 20 (more particularly, disposed on interposer 22) are shown in in this exemplary embodiment to include a digital ASIC module 24 and one or more memory modules 26. Digital ASIC module 24 functions as a router, switch and multi-core processor, interacting with memory modules 26 to send/receive electronic data signals required for proper switching and routing connections. Electrical connections between ASIC module 24 and memory modules 26 for this data transfer functionality are typically provided through interposer 22.

Also assembled on package substrate 20 of interconnection card 10 is a plurality of silicon photonic integrated circuits (PICs) 28 that are also mounted on interposer 22 in the manner shown in FIGS. 1 and 2. Each of these silicon PICs 28 contains components for optical signal processing, such as optical waveguides and optical modulators (e.g., MZIs), as well as configurations for performing optical-to-electrical conversions and electrical-to-optical conversions. A plurality of electrical modules 30 are shown as disposed over and coupled to associated PICs 28. In most cases, electrical module 30 is flip-chip bonded to PIC 28. Electrical module 30 is shown as comprising a "serializer/deserializer" (SERDES) component for interleaving or de-interleaving separate electrical signal paths. In this specific configuration, electrical signal paths from electrical module 30 pass through PIC 28 (for example, with TSVs formed through the thickness of PIC 28) and thereafter to interposer 22 to be routed to the specific, identified port of ASIC 24.

Besides the optical and electrical components assembled on package substrate 20, an exemplary optical interconnection card 10 formed in accordance with the present invention also includes one or more laser transmitter modules 40, as shown in FIGS. 1 and 2. In the specific embodiment shown in FIG. 1, a plurality of laser modules 40 is shown as attached to PCB 12. In the particular embodiment shown in FIG. 1, the laser sources include a tunable laser transmitter module 40-1, a CWDM laser transmitter module 40-2, a DWDM laser transmitter module 40-3, and a LAN-WDM laser transmitter module 40-4. It is to be understood that various other laser transmitters may be included within interconnection card 10. Moreover, some applications may require the utilization of only a single laser transmitter.

Additionally, it is contemplated that for specific applications only one (or selected ones) of the laser transmitters included on an exemplary configuration of interconnection card 10 may be energized and used. Indeed, an advantage of the configuration of the present invention is that the laser transmitter modules may be customized for a specific application (e.g., data center, telecommunications, etc.). The specific details of the arrangement of these laser transmitter modules are discussed below in association with FIGS. 24-44.

Interconnection card 10 is shown as further comprising a microprocessor 32 and associated sensing and control circuitry 34 (directly disposed on and electrically connected to PCB 12) that are utilized to control electrical signaling and interfacing between card 10 and other system components. For example, when interconnection card 10 functions as a "daughter card" that is plugged into a motherboard/backplane connection of a larger system (where the larger system may be a data center that is used to constantly transfer and control high density, high bandwidth data signals), microprocessor 32 and sensor/controller circuit 34 function to ensure proper switching and signal routing in this environment.

As mentioned above, it is an aspect of the present invention to provide passively-aligned, high density optical fiber connections between the various components populating interconnection card 10, as well as passively-aligned optical fiber connections between fiber connector 16 and each silicon PIC 28. In the following paragraphs, three different passively-aligned fiber connector configurations will be described. These connector configurations include (as shown in FIG. 1): (1) a first fiber array connector 50 for coupling an array of optical fibers to the optical output of each laser transmitter 40; (2) a second fiber array connector 52 for coupling an array of optical fibers (from a given laser transmitter 40) to an input port of a selected silicon PIC 28; and (3) a third fiber array connector 54 for coupling an array of optical fibers from optical fiber connector 16 to silicon PIC 28. In many exemplary embodiments of the present invention, polarization-maintaining (PM) optical fibers may be used to provide communication between laser transmitter 40 and silicon PIC 28, with single-mode fibers used for communication between silicon PIC 28 and optical connector 26. However, it is to be understood that in the most general sense, any appropriate types of optical fibers may be used to form the communication paths, with the various silicon materials supporting the fiber arrays appropriately patterned and etched to provide passively alignment between the fiber array connectors and the associated optical elements.

In accordance with the teachings of the present invention, silicon processing techniques, such as anisotropic etching (using KOH, for example), deep reactive ion etching (DRIE), and the like, are utilized to create alignment features on each silicon PIC 28, as well as silicon support structures for each fiber array connector and laser transmitter module 40. The ability to create alignment features with sub-micron tolerances in silicon allows for the creation of high density, repeatable optical interconnections with passive alignment techniques (i.e., without the need to perform active alignment, which is a tedious and time-consuming process).

Figure 3:
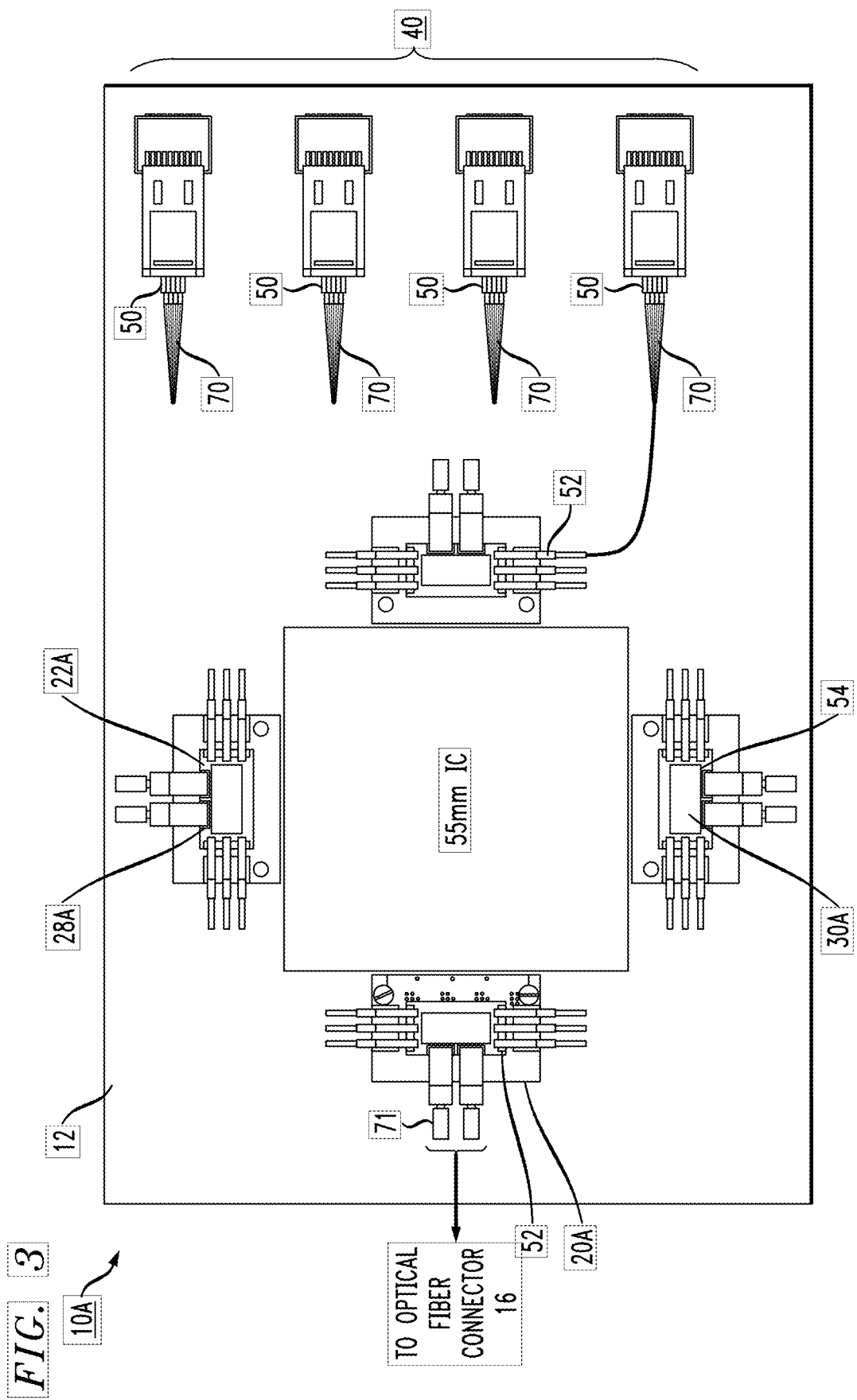
FIG. 3 is a top view of an alternative embodiment of an interconnection card formed in accordance with the present invention.

FIG. 3 is a top view of an alternative arrangement of an interconnection card 10A also formed in accordance with the present invention. In this arrangement, a set of separate package substrates 20A is positioned on PCB 12 to surround a central region where associated electronics is disposed (such as, for example, ASIC module 24 of FIG. 1). A separate silicon interposer 22A is disposed over each package substrate 20A in the particular embodiment of FIG. 3. As also shown in FIG. 3, a silicon PIC 28A and electrical module 30A are disposed on each interposer 22A. Interconnection card 10A also includes a plurality of laser transmitter modules 40 disposed on PCB 12.

Passively-aligned fiber array connectors 50 and 52 are shown in FIG. 3, which clearly illustrates the locations of connections of optical fibers between laser transmitter modules 40 and silicon PICs 28. In particular, a first fiber array connector 50 is shown as coupled to each separate laser transmitter module 40 and provides a passively aligned connection between a laser diode array (as described below) and an optical fiber array 70. Second fiber array connector 52 is used to provide connection between the opposing end of optical fiber array 70 and a selected silicon PIC 28A (here, providing passively aligned coupling of optical fiber array 70 to a plurality of waveguides (not shown) formed in silicon PIC 28A). Third fiber array connector 54 is also shown as coupled to silicon PIC 28A and used, as discussed above, to provide bidirectional optical communication through optical connector 16 (along an array of optical fibers 71), creating optical signals into and out of interconnection card 10.

Various other interconnection configurations supporting high density, high bandwidth optical connections are possible and are contemplated as falling within the scope of the present invention, where each interconnection configuration includes an electrical connection (such as a backplane-pluggable connector) and a plurality of passively-aligned optical fiber array connectors. In these and various other embodiments of the present invention, 2.5D/3D packaging techniques are utilized to integrate various functions within package substrate 20 on PCB 12. In some cases, an interconnection configuration formed in accordance with the present invention can accommodate 192 pairs of optical fiber at optical fiber connector 16, each carrying 100-400 Gb/s of data. Thus, a single interconnect configuration of the present invention is able to provide an optical I/O bandwidth of 19.2-76.8 Tb/s in each direction.

With this high-level understanding of the components of the inventive interconnect configuration, the details of each specific fiber array connector type and its passive alignment with its associated optical component will be discussed in detail below.

Passively-Aligned Fiber Array Connectors

A. Laser Transmitter with Fiber Array Connector

In order to provide the increased transmission capacity required for high-density, high-capacity interconnection systems, an exemplary laser transmitter module 40 is formed in accordance with preferred embodiments of the present invention to house an array of N laser diodes, where in a typical embodiment N=4. While various approaches have been put forward to reduce the overall footprint of these laser modules, the need to include a plurality of separate laser diodes within a single transmitter module, as well as mount several laser transmitter modules on an interconnection card remain problematic. Moreover, as discussed above, it is desired to provide a reliable passive alignment between a given plurality of laser diodes and a plurality of optical fibers.

Figure 4:
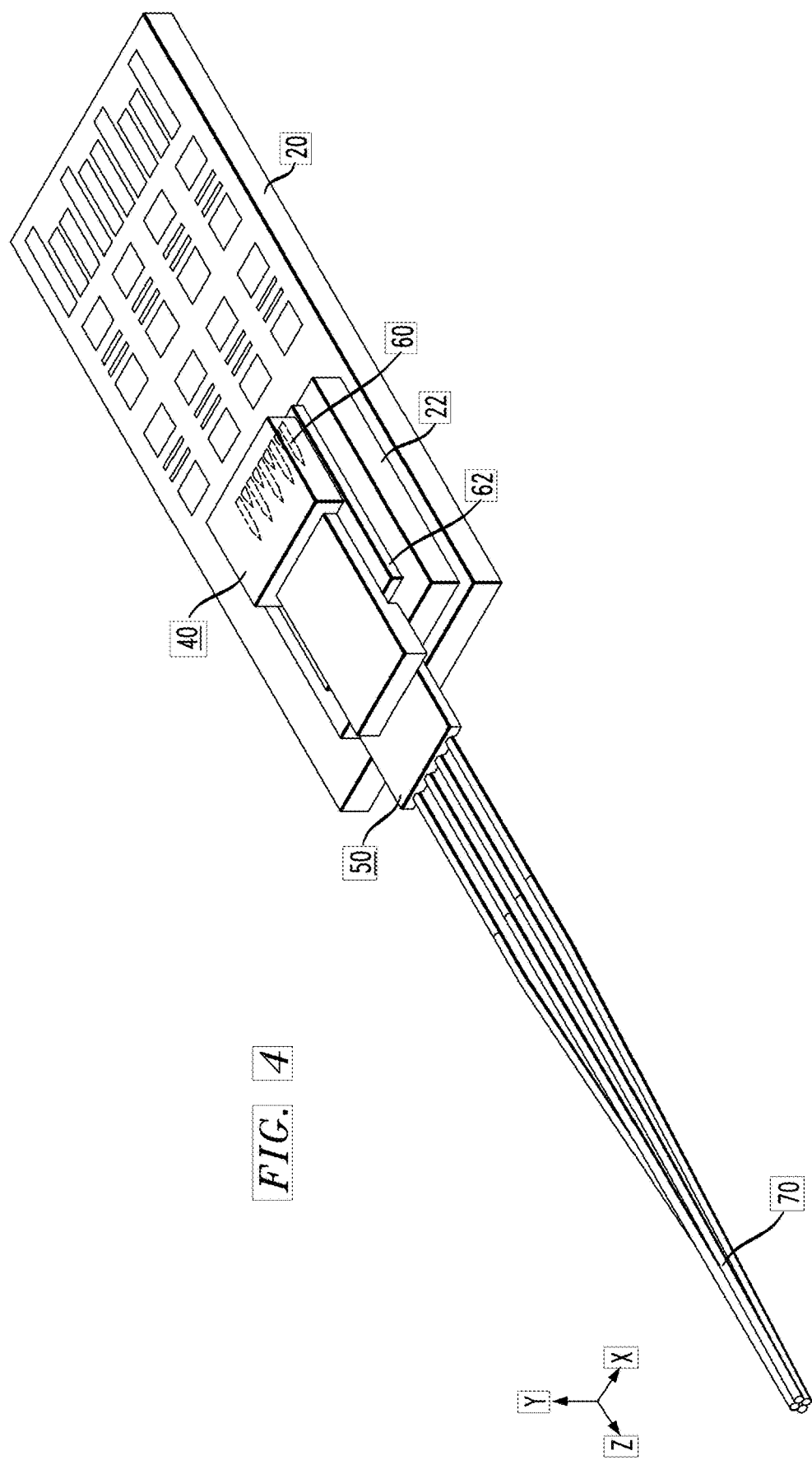
FIG. 4 is an isometric view of an exemplary laser transmitter module formed in accordance with the present invention, for utilization with the inventive interconnection card.
Figure 5:
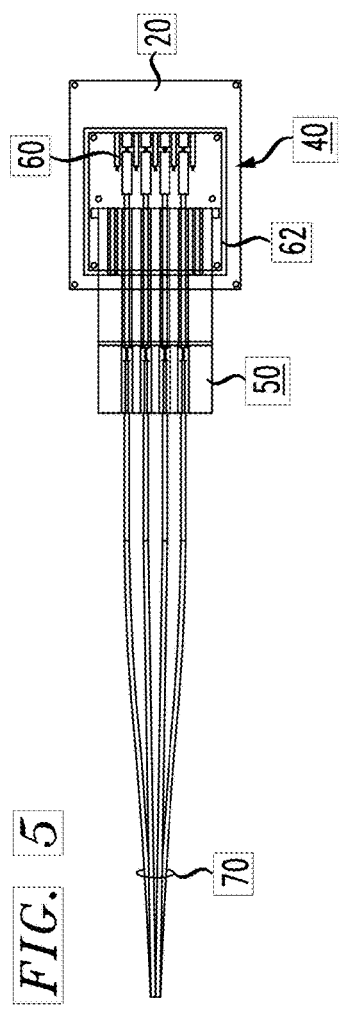
FIG. 5 is a top view of the exemplary laser transmitter module of FIG. 4.
Figure 6:
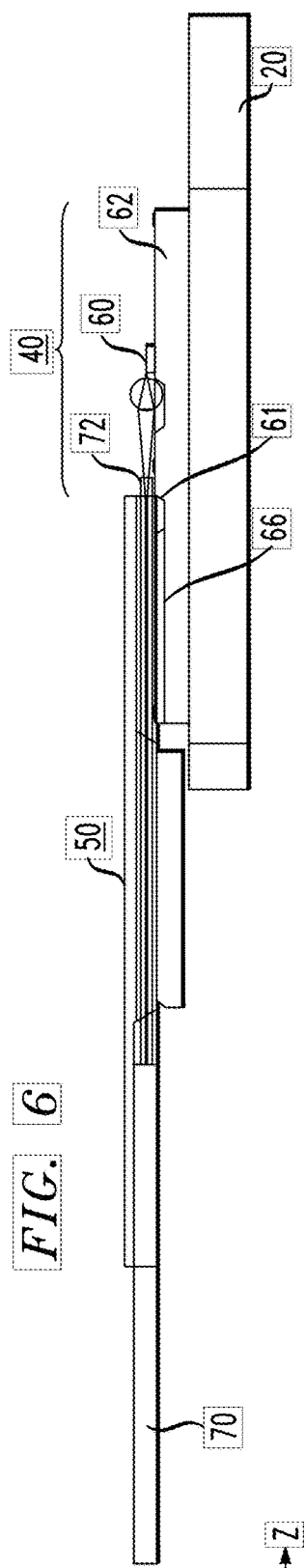
FIG. 6 is a cut-away, simplified side view of the exemplary laser transmitter module of FIG. 4.
Figure 7:
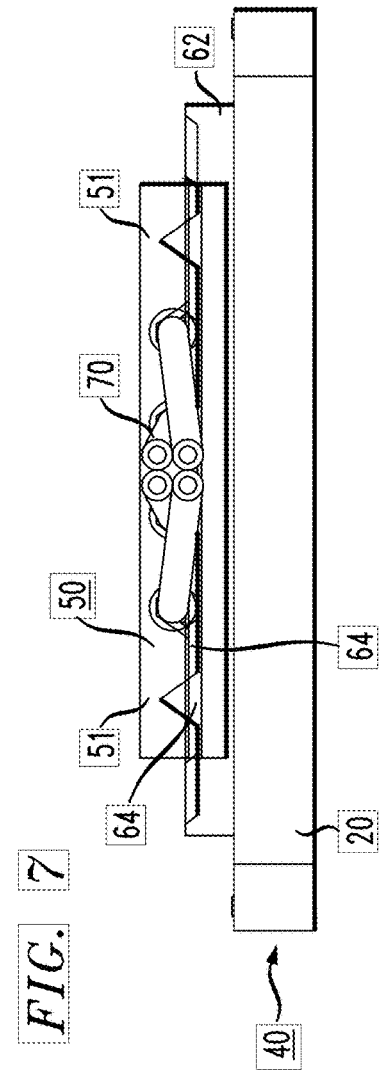
FIG. 7 is a cut-away end view of the exemplary laser transmitter module of FIG. 4.

FIG. 4 is an isometric view of an exemplary laser transmitter module 40 utilized as a component on interconnection card 10, where laser transmitter module 40 is formed in this example to include a plurality of separate laser diodes 60 disposed in a one-dimensional array configuration and passively aligned with first fiber array connector 50 as defined above. FIG. 5 is a top view showing the aligned relationship between laser transmitter module 40 and first fiber array connector 50. FIG. 6 is a cut-away side view of selected components of laser transmitter module 40, and FIG. 7 is a cut-away end view of the arrangement, best illustrating the passive alignment between laser transmitter module 40 and first fiber array connector 50. FIG. 7 also illustrates a preferred arrangement of the optical fibers exiting first fiber array connector 50, showing the ability to collect the set of individual fibers into a "rounded" assembly that can easily be routed to a specific silicon PIC 28 on interconnection card 10.

It is to be understood that laser transmitter module 40 is ultimately supported on PCB 12 with the various other components of card 10, as shown in FIG. 1 (and also shown in configuration 10A of FIG. 3). Referring to FIGS. 4-7, laser diode array 60 is shown as supported by a silicon submount 62 that is disposed on (for example) package substrate 20. Various other support configurations are possible and will be discussed below. In particular, in several embodiments silicon submount 62 may be disposed on a silicon interposer 22, which is then itself mounted on package substrate 20.

Figure 8:
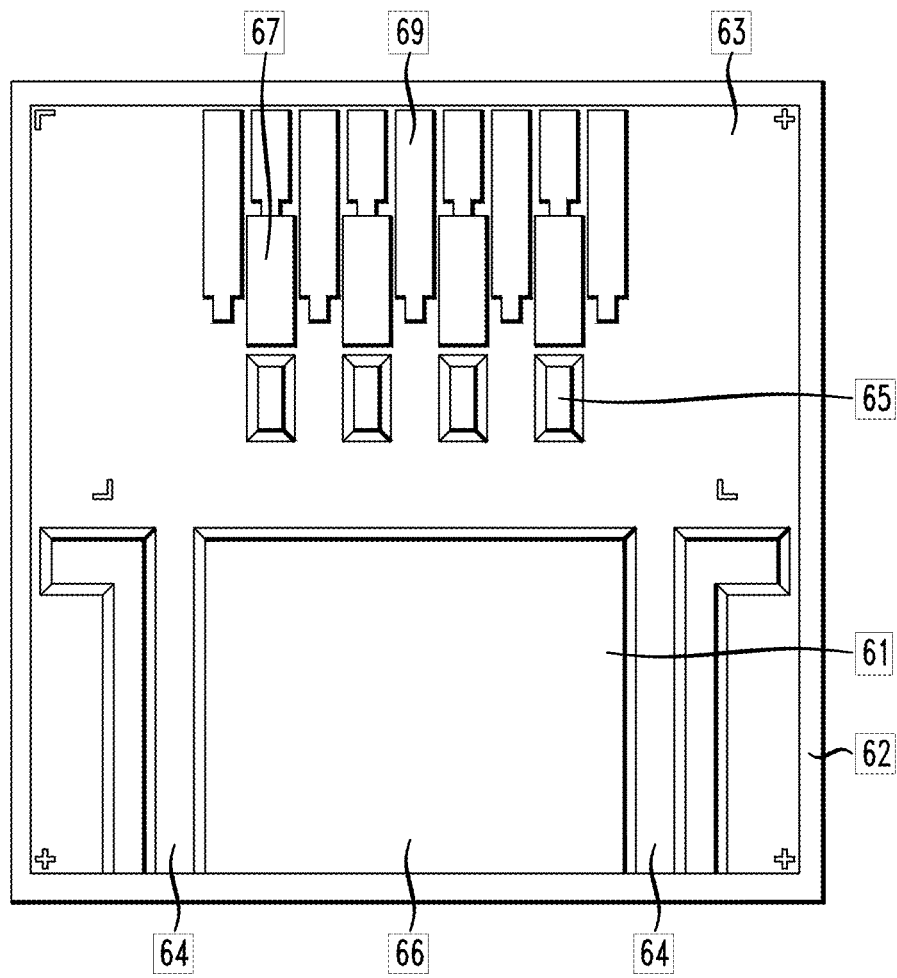
FIG. 8 illustrates a patterned silicon substrate utilized as a submount for a laser transmitter module formed in accordance with the present invention.
Figure 9:
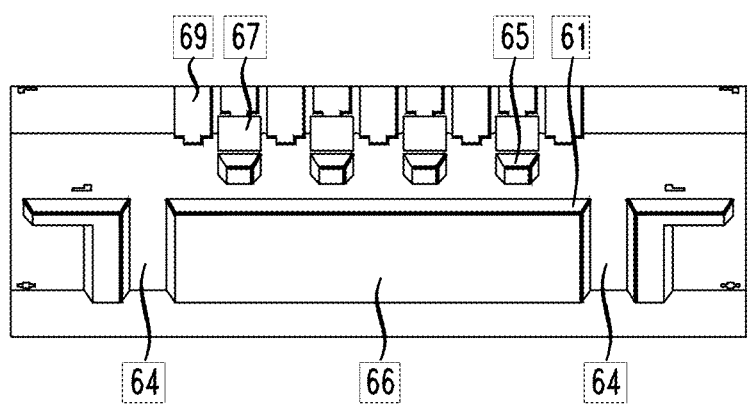
FIG. 9 is an alternative view of the patterned silicon substrate of FIG. 8.

In accordance with the principles of present invention, and shown in detail in FIGS. 8 and 9 (as well as FIGS. 4-7), silicon submount 62 is patterned and etched in a known manner to create a pair of alignment rails 64 and a central recessed area 66 in a top surface 63 of silicon submount 62. In one exemplary embodiment of the present invention, high-accuracy V-grooves are formed to create alignment rails 64, where the use of an anisotropic etchant (KOH, for example) creates sidewalls at an angle of 54.74° with respect to the surface of silicon submount 62 (when using a (100) silicon wafer as the starting material for silicon submount 62). Central recessed area 66 may be formed in silicon submount 62 using a well-controlled etching technique, such as deep RIE (reactive-ion etching) or anisotropic etching. Central recessed area 66 is sized, as discussed below, to support the fiber array portion of first fiber array connector 50, with a vertical end wall 61 of recessed area 66 functioning as a Z-axis "stop" to control the axial separation between fiber $70_i$ forming optical fiber array 70 and its associated laser diode 60*i* from laser diode array 60 (this aspect also shown in FIG. 6, and particularly illustrated in FIGS. 10-12, discussed below).

Also shown in FIG. 8 is a set of etched features 65 for supporting a plurality of lenses (not shown in this view) in optical alignment with laser diodes that will be positioned on contact pads 67. Electric contact pads 69, used to provide input electrical signals to the laser diodes, are also shown in FIG. 8. Advantageously, the ability to pattern and etch silicon submount 62 ensures that features 65 align with the laser diodes mounted on submount 62, as well as the individual fibers within first fiber array connector 50 that is passively aligned with laser transmitter module 40.

Figure 10:
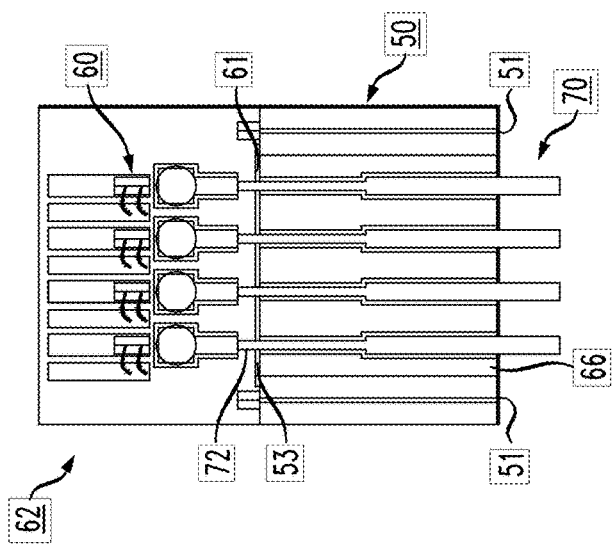
FIG. 10 is a top view of the silicon submount of FIG. 8, in this view populated with an array of laser diodes and an associated array of lenses.

FIG. 10 is another top view of silicon submount 62, in this case as populated with an array of laser diodes 60 disposed on contact pads 67. Also shown in this view is an array of spherical lenses 59 disposed within etched features 65, as described above. The individual wirebonds between laser diodes 60 and electrical contacts 69 is also shown in this view. Alignment rails 64 and recessed area 66, as defined above, are also shown.

Figure 11:
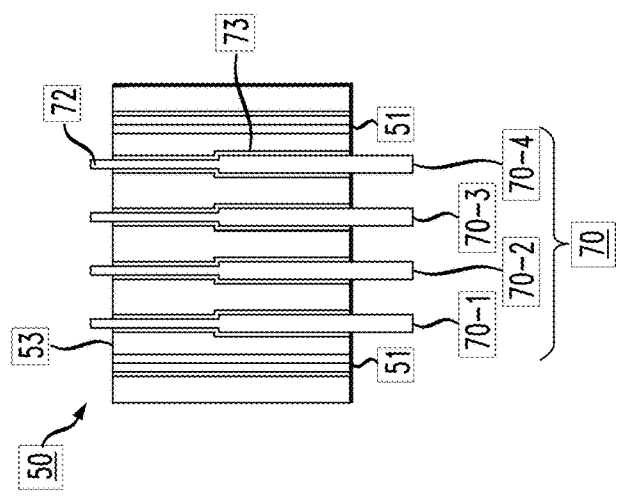
FIG. 11 is a top view of an exemplary silicon submount used as part of a fiber array connector for coupling an array of optical fibers to an array of laser diodes.

FIG. 11 is a top view of a portion of first fiber array connector 50, formed as shown to include a pair of alignment trenches 51 that mate with alignment rails 64 of silicon submount 62 so as to provide passive optical alignment between laser diode array 60 and optical fiber array 70. Still referring to FIG. 11, optical fiber array 70 is shown in position within fiber connector 50, where each separate fiber 70-1, 70-2, etc., may be supported within an associated V-groove 73 etched into the silicon material of connector 50. In this particular embodiment, stripped end terminations 72 of fibers 70 are shown as extending beyond an end wall termination 53 of connector 50.

Figure 12:
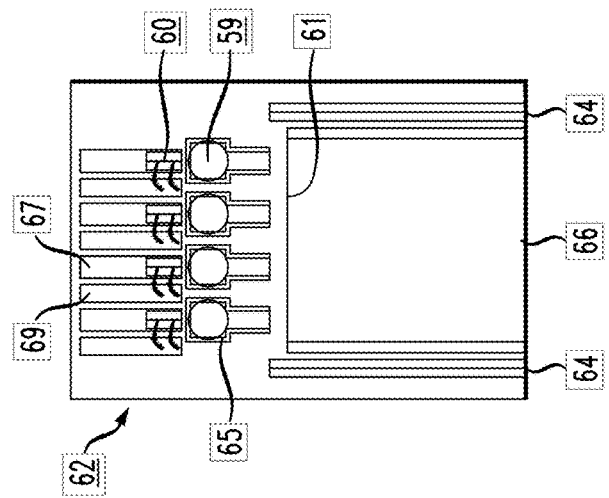
FIG. 12 shows the silicon submount of FIG. 11 in position (and alignment) with the laser transmitter module silicon submount of FIG. 10.

FIG. 12 is a top view of fiber connector 50 positioned within silicon submount 62 so as to provide passive alignment between laser diode array 60 and optical fiber array 70. As best shown in the following drawings, alignment trenches 51 of connector 50 engage with alignment rails 64 of submount 62 in manner such that the fiber-support V-grooves 73 of connector 50 passively align with the position of each separate laser diode forming laser diode array 60. When connector 50 is fully inserted on central recessed area 66, end wall 53 of connector 50 will contact end wall 61 of recessed area 66, providing precise Z-axis separation control between PM fiber array 70 and laser diode array 60.

Figure 13:
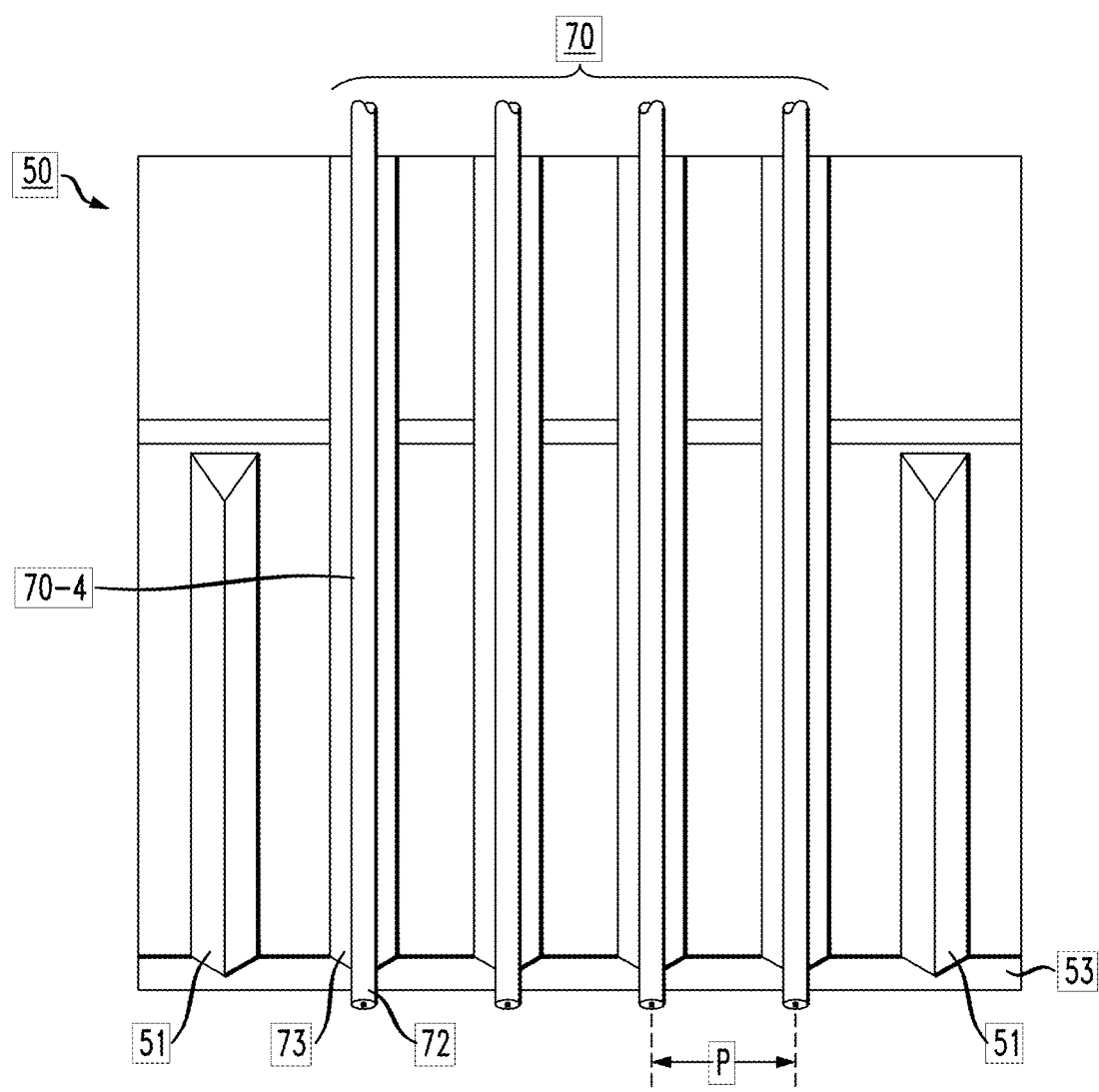
FIG. 13 is an isometric view of a first fiber connector array, as used in the illustration of FIG. 11, showing in particular the etched locations for support the optical fibers and creating alignment rails.

FIG. 13 is an isometric view of a portion of first fiber array connector 50, clearly illustrating the formation of alignment trenches 51. Also shown in this view is the plurality of V-grooves 73 used to support individual fibers of optical fiber array 70. In accordance with the principles of the present invention, the silicon material of connector 50 is patterned and etched in a manner that defines a specific pitch P between adjacent V-grooves 73, where this same pitch P is used to control the spacing between adjacent laser diodes 60 on silicon submount 62. End wall 53 of first fiber array connector 50 is also shown in the view of FIG. 13. Depending on the embodiment, end wall 53 may be either vertical or angled (the angle created by etching along the sidewall with KOH, for example, to create an angle of 54.74°).

FIG. 14 is a cut-away longitudinal view showing first fiber array connector 50 as mated with silicon submount 62 to passively align laser diodes 60 with optical fiber array 70. Particularly evident in this view is etched feature 65 used to support a collimating lens 59 in alignment with its associated laser diode 60, as well as the contact between end wall 53 of first fiber array connector 50 and end wall 61 of central recessed area 66 of silicon submount 62. FIG. 15 is a cut-away side view that clearly illustrates the alignment created between silicon submount 62 and first fiber array connector 50 by virtue of the mating between alignment rails 64 of silicon submount 62 and alignment trenches 51 of first fiber array connector 50. The pitch P of fiber-supporting V-grooves 73 (and its alignment with laser diode array 60) is also clearly illustrated in this view. While any desired pitch may be used, in exemplary embodiments of the present invention, a pitch of 500 µm or 750 µm has been used for providing coupling between a laser diode array and an array of optical fibers.

B. Silicon Photonic Integrated Circuit with Fiber Array Connectors

FIG. 16 is an isometric view of exemplary passively-aligned fiber connections associated with silicon PIC 28. In particular, the view of FIG. 16 is associated with interconnection card 10A shown in FIG. 3 and illustrates a plurality of second fiber array connectors 52 coupled to silicon PIC 28A, as well as a pair of third fiber array connectors 54 coupled at an appropriate location to silicon PIC 28A. It is to be understood that a similar set of passively-aligned fiber connections may be used with interconnection card 10 shown in FIG. 1. An associated electrical module 30A (e.g., SERDES) is shown as positioned on (and typically flip-chip bonded to) silicon PIC 28A.

As will be described in detail below, each second fiber array connector 52 is formed of a silicon substrate that is patterned and etched to form a plurality of V-grooves for supporting the individual fibers of optical fiber array 70, as well as a pair of alignment rails that provides passive alignment with optical waveguides formed within silicon PIC 28A. Each third fiber array connector 54 is also formed using a silicon substrate, with etched V-grooves and alignment rails to provide passively-aligned connection between an array of optical fibers 71 and waveguides formed within silicon PIC 28.

Figure 17:
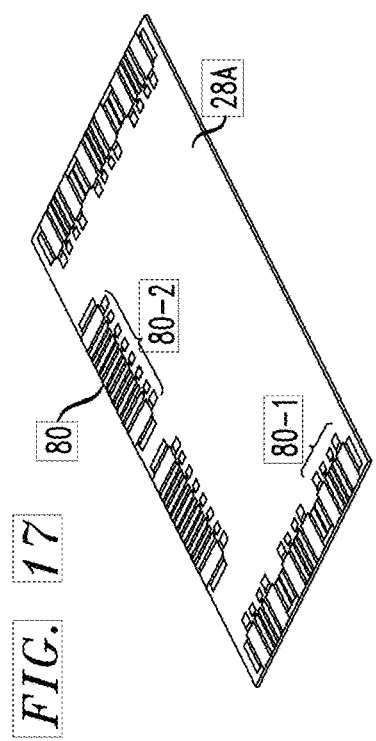
FIG. 17 is an isometric view of the silicon substrate of FIG. 16, illustrating the various etched regions formed by patterning the silicon substrate, the etched regions used for alignment and attachment purposes.

In particular, silicon PIC 28A is etched around its periphery in a well-defined manner to create alignment channels for mating with the alignment rails of each fiber array connector 52 and 54 so as to provide passive x-y alignment between connectors 52, connectors 54 and optical waveguides formed within silicon PIC 28A. FIG. 17 is an isometric view of silicon PIC 28A, showing various oxide etch patterns 80 around the outer periphery of silicon PIC 28A, the etched regions used to provide passive optical alignment and create trenches for holding epoxy and other materials.

A first etch pattern 80-1 is designed to provide passive alignment (and mechanical bonding) between an exemplary second fiber connector array 52 and optical waveguides (not shown) formed in silicon PIC 28A. A second etch pattern 80-2 is particularly designed to provide passive alignment (and bonding) between an exemplary third fiber connector array 54 and silicon PIC 28A. Advantageously, the specific details of each etch pattern can be designed on a case-by-case basis, as a function of the number of individual fibers forming the connecting array and the pitch of the array, as well as the diameter of an individual fiber itself.

Figure 18:
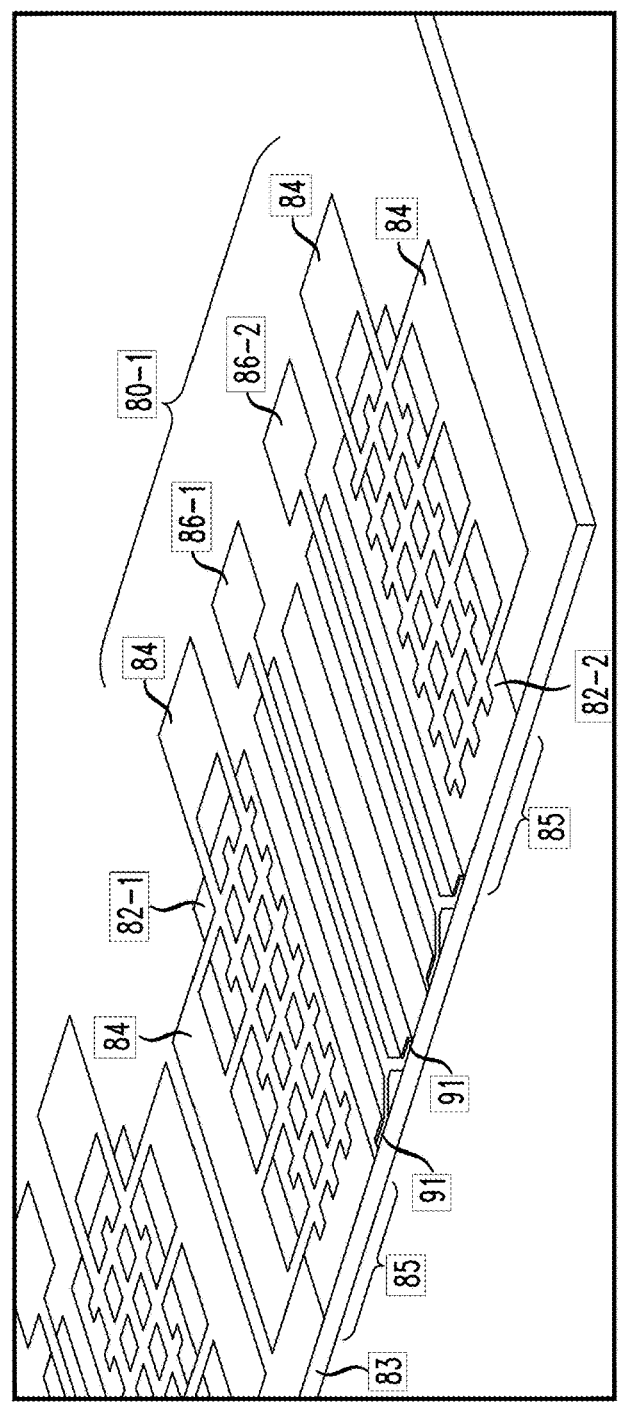
FIG. 18 is an enlarged view of a portion of the silicon substrate of FIG. 17, showing both the trenches used to hold epoxy (for bonding an associated fiber array connector), as well as a pair of channels used to apply index-matching fluid and direct it to the endface of the substrate.

FIG. 18 is an enlarged view of a portion of oxide etch pattern 80-1, and particularly illustrates a set of epoxy trenches 82 etched into the surface of silicon PIC 28A and used to control the flow of bonding material (such as epoxy) that is used to physically attach second fiber connector array 52 to silicon PIC 28A. In the particular embodiment shown in FIG. 18, epoxy trenches 82 are created in two groups of grid-like patterns (denoted 82-1 and 82-2). A set of epoxy loading recesses 84 are shown at locations around etch patterns 82-1 and 82-2, where in use an epoxy material is injected into recesses 84 to thereafter flow into the etched recesses of patterns 82-1 and 82-2. By virtue of using the grid-like patterns, the epoxy will spread out to cover a sufficient surface area portion of the region where second fiber array connector 42 will bond to silicon PIC 28A. For the purposes of illustration, etch pattern 82-1 is shown as being filled with an epoxy material.

In further accordance with the principles of the present invention, oxide etch pattern 80-1 is shown as also comprising a pair of channels 86-1 and 86-2 disposed as shown in locations between the areas where the individual waveguides are positioned (as discussed below). An index-matching fluid may be introduced into channels 86-1 and 86-2 and permitted to flow into a set of recessed pockets along an edge endface 83 of silicon PIC 28A. As shown below in association with FIG. 19, the index-matching fluid is directed into the precise regions where the individual fibers (e.g., 70-1 70-2 . . . ) will be butt-coupled against edge endface 83. The index-matching fluid not only reinforces the mechanical attachment of second fiber connector array 52 to silicon PIC 28A, but improves the optical coupling between the individual fibers and the optical waveguides formed within silicon PIC 28A.

FIG. 19 is a top view of a portion of an exemplary second fiber array connector 52 as positioned along associated edge endface 83 of silicon PIC 28A. The alignment between individual fibers forming optical fiber array 70 and a waveguide array W is evident in this view. Index-matching fluid 91 is shown as filling recessed edge regions between fiber array 70 and waveguide array W. As will be described below, x-y alignment between second fiber array connector 52 and silicon PIC 28 is provided by alignment rails and channels formed in each component, respectively (discussed in association with following FIGS. 20-23). The z-direction (axial alignment) between the two is provided by a coverplate portion of second fiber array connector 52, as discussed in detail below in accordance with FIG. 24.

Now reviewing the x-y passive alignment capabilities, FIG. 20 is a top view of an exemplary silicon substrate 90 formed (i.e., etched) to include a central recessed area 92 for holding a cabled portion of optical fiber array 70. Also formed in silicon substrate 90 is a set of V-grooves 94 for supporting the individual fibers of array 70 (similar to the configuration at the opposing end of optical fiber array 70, where a first fiber array connector 50 is utilized).

Silicon substrate 90 is further formed to include a pair of beveled corners 96, as best shown in FIG. 21. Bevels corners 96 are utilized, in conjunction with an adjacent V-groove 94) to form a pair of alignment rails 97 (illustrated as 97-1 and 97-2 in FIG. 21) that will engage with alignment channels formed within etch pattern 80-1. The engagement of these components thus provides the x-y alignment of second fiber connector array 52 with silicon PIC 28A.

FIG. 22 is a view of this x-y alignment capability. Here, silicon substrate 90 is illustrated in its inverted position over silicon PIC 28A, with V-grooves 94 positioned over the locations of waveguides W within silicon PIC 28A. Beveled edges 96 are shown as fixed within alignment channels 85 of silicon PIC 28A. Positioned in inverted form over silicon PIC 28A allows for top surface 91 of silicon substrate 90 to contact the epoxy-filled trenches 82-1 and 82-2, providing mechanical attachment between second fiber connector array 52 and silicon PIC 28A.

As mentioned above, axial alignment between the components is provided by a separate coverplate element of second fiber array connector 52 that abuts against edge endface 83 of silicon PIC 28A as the two elements are joined together. FIG. 23 is a top view of second fiber array connector 52, similar to that of FIG. 20, but in this view populated with fiber array 70 and illustrating a coverplate 98 positioned as shown. It is to be noted that the positioning of coverplate 98 allows for the end section E of silicon substrate 90 to remain exposed, so that it will bond with silicon PIC 28A when the connector is inverted over and attached to silicon PIC 28A. FIG. 24 is a cut-away side view illustrating the abutment of coverplate 98 with edge endface 83. Coverplate 98 functions as a physical "stop" along the z-direction (i.e., along the optical axis) and thus provides a consistent and controllable spacing between the end termination of each fiber and an input coupling endface of its associated optical waveguide.

Figure 25:
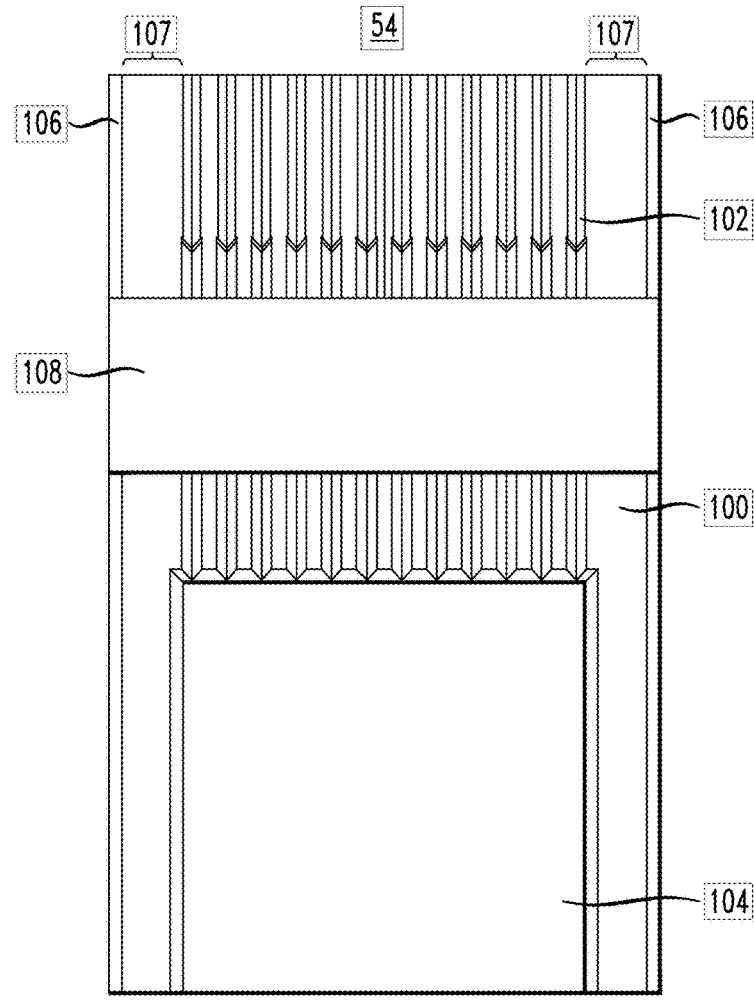
FIG. 25 is a top view of an exemplary silicon substrate used in the formation of an exemplary third fiber array connector in accordance with the present invention.

FIG. 25 is a top view of a silicon substrate portion of third fiber array connector 54 formed in accordance with the present invention. Similar to second fiber array connector 52, third fiber array connector 54 includes a silicon substrate 100 that is etched to form a plurality of V-grooves 102 for supporting individual fibers forming optical fiber array 71. A larger recessed area 104 is formed to support the outer packaging associated with optical fiber array 71. A pair of beveled edges 106 is used to create alignment rails 107 in combination with adjacent V-grooves 102, as shown in FIG. 25. A cover plate 108, used to abut silicon PIC 28A and provide an axial "stop", fixing the separation between the end faces of fibers 70 and the waveguides formed in silicon PIC 28A. While not explicitly shown, etch pattern 80-2 formed at a defined location on the periphery of silicon PIC 28A (see FIG. 17) and is created to include alignment features, waveguides, epoxy trenches, and index-matching fluid channels in an arrangement that provides mechanical attaching and optical alignment between third fiber connector array 54 and silicon PIC 28.

Besides the ability to form passively-aligned, high-density optical fiber connections, various embodiments of an interconnection configuration of the present invention may include other features to further improve the performance of the configuration, its manufacturability, cost, and the like. Selected ones of these features will be discussed below.

Laser Transmitter Module Lid

Figure 26:
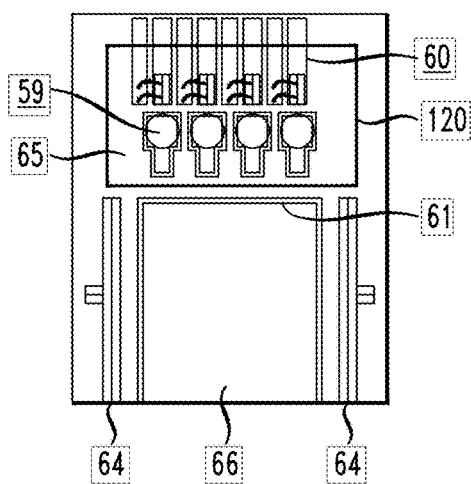
FIG. 26 is a top view of an exemplary laser transmitter module, specifically illustrating a location for a sealing ring utilized for attaching a lid over the included laser diode array.
Figure 27:
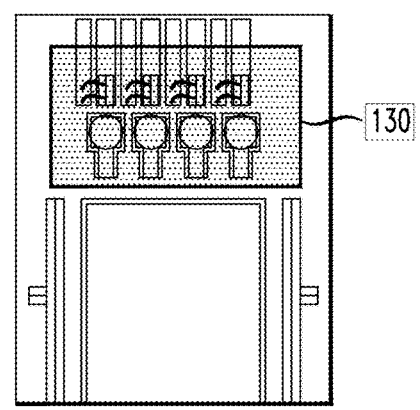
FIG. 27 is a top view of the same laser transmitter module as shown in FIG. 26, in this case showing an exemplary lid in place over the optical components (laser diode array and lens array)
Figure 28:
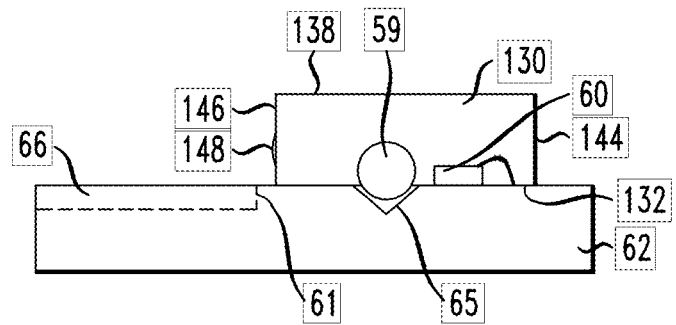
FIG. 28 is a simplified side view of a portion of the configuration of FIG. 27, illustrating the relationship between the location of an optical fiber array and the laser diode array.

FIG. 26 is a top view of an exemplary laser transmitter module 40, similar to that illustrated in FIG. 10, in this case also including a sealing location 120 for placement of a lid component over a portion of laser transmitter module 40. In situations where it is desired to create a hermetic enclosure, sealing location 120 may comprise a nano-foil, glass frit, or other suitable metallic connection material. Otherwise, sealing location 120 may be a trench for accepting bonding material or a non-conductive lid such as mode out of silicon or glass (or even plastic), thereafter attached with epoxy for a non-hermetic module. FIG. 27 is the same view, in this case with a module lid 130 disposed in place over the optical component portion of laser transmitter module 40; namely, laser diode array 60 and the array of associated lenses 59. It is to be understood that if the configuration further includes an array of optical isolators, the isolators would also be encased by module lid 130 (see, for example, FIGS. 42 and 43). For the sake of discussion, module lid 130 is shown as being transparent, allowing laser diode array 60 and lens array 59 to be viewed in their positions underneath module lid 130; it is to be understood that module lid 130 is typically opaque and generally these components are not visible. FIG. 28 is a simplified side view of a portion of the arrangement of FIG. 27, showing in particular the positioning of module lid 130 over laser diode array 60 and lens array 59.

Figure 29:
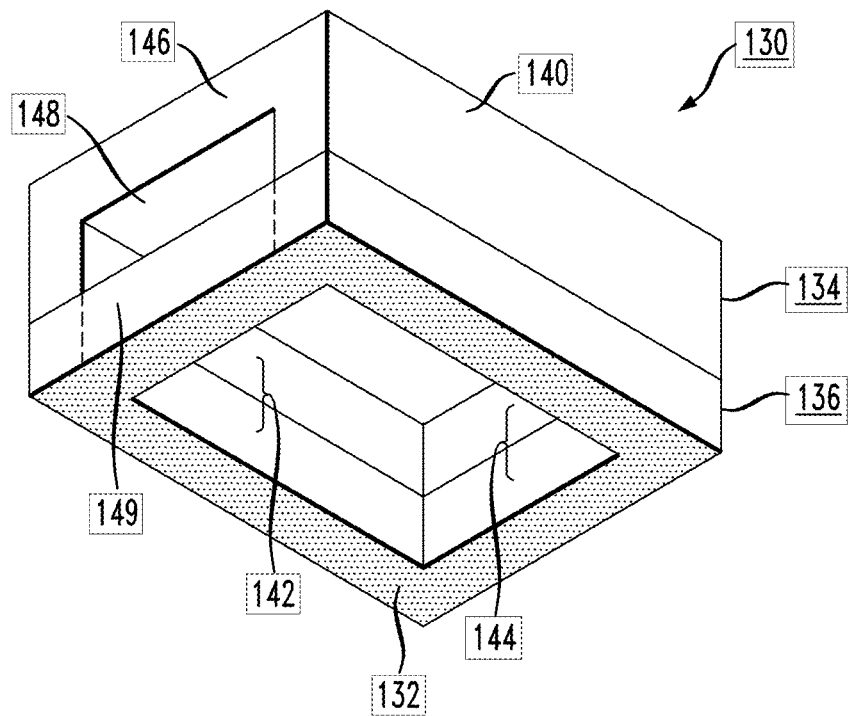
FIG. 29 is an isometric view from the underside of an exemplary laser transmitter module lid formed using a wafer-scale process in accordance with the present invention.

It is an aspect of the present invention that in most cases module lid 130 is formed of silicon material and, as a result, wafer-scale processing may be used to efficiently form a plurality of lids at the same time. FIG. 29 illustrates an exemplary module lid 130 formed using an exemplary wafer-scale process, where FIG. 29 is an isometric view from underneath module lid 130. A shaded lower surface 132 is defined as the surface that bonds with sealing location 120 as shown in FIG. 26. The structure as depicted in FIG. 29 is formed by bonding together two elements, shown as top element 134 and bottom element 136, formed by etching particular features into a pair of silicon wafers and then bonding the wafers together such that dicing through the pair of joined wafers at specific locations creates the structure as shown in FIG. 29. The wafer fabrication process will be discussed below.

Continuing with the description of module lid 130 in FIG. 29 (with reference to FIG. 28 as well), a top wall 138 is shown (hereinafter referred to as "ceiling 138"), as well as a pair of opposing sidewalls 140, 142. A rear wall (solid) 144 is shown, as well as a front wall 146 including a window 148. The optical signal output from laser diode 60 passes through window 148 and is directed toward spherical lens 59. In some configurations, front wall 146 may be formed to include a "door 149" instead of window 148, where door 149 extends to lower surface 132, as indicated by the dotted lines in FIG. 29. In some configurations, window 148 is formed to include an anti-reflective coating to prevent reflections from re-entering laser diode 60.

A variety of different fabrication processes may be used to form module lid 130 and its associated window 148. FIGS. 30-37 describe an exemplary set of processing steps that may be used in a wafer-scale fabrication process to efficiently create a large number of lid/window assemblies.

Figure 30:
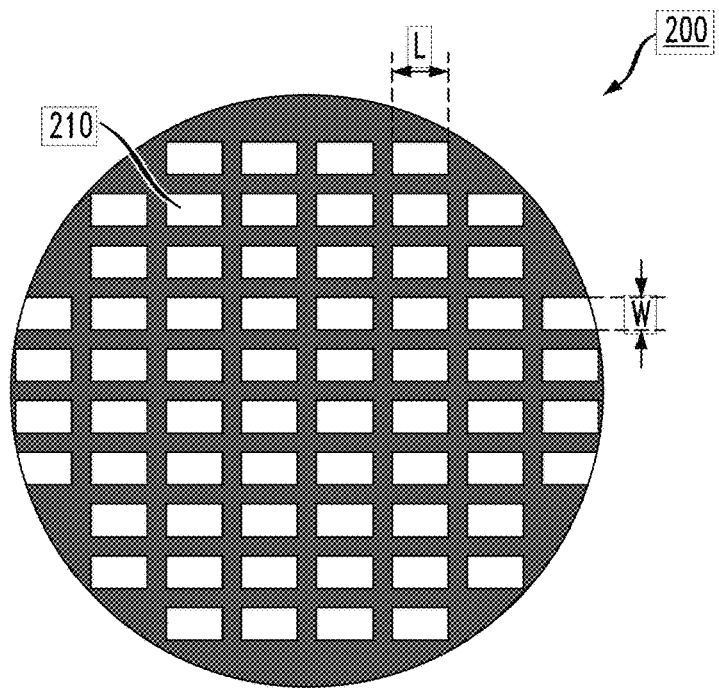
FIG. 30 is a top view of a first wafer as processed for use in forming the lid as shown in FIG. 29.
Figure 31:
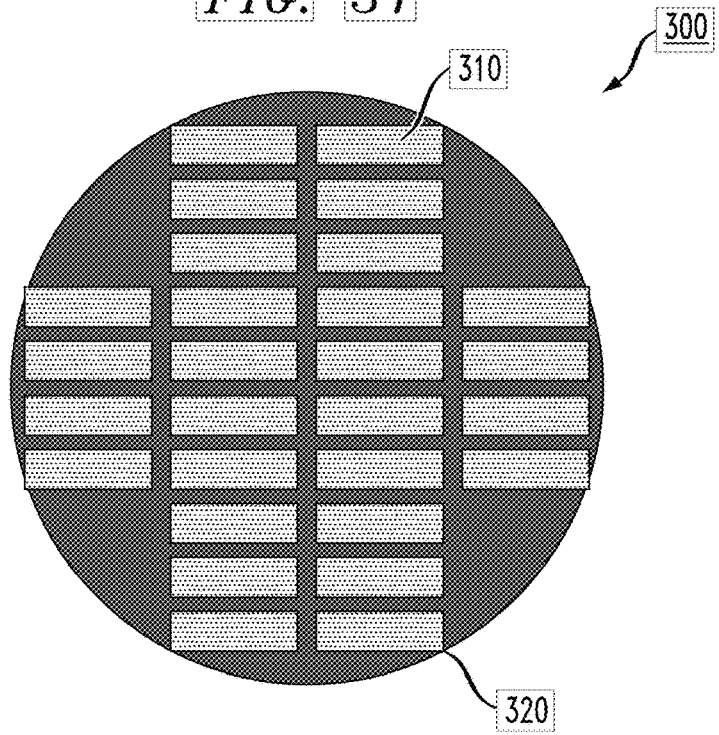
FIG. 31 is a top view of a second wafer as processed for use in forming the lid as shown in FIG. 29.

FIG. 30 is a top view of a first wafer 200 that is processed to create a plurality of rectangular openings 210 that correspond to the dimensions of the bottom opening within lower surface 132 of module lid 130, as shown in FIG. 31. Each opening 210 is formed completely through the thickness of first wafer 200 (using a deep RIE process, for example), where wafer 200 is patterned such that openings 210 have a predetermined length L and a predetermined width W associated with known dimensions of lower surface 132. As will become evident below, the remaining silicon material will form portions of the sidewalls of lid 130 (where many lids are formed in a single wafer).

Figure 32:
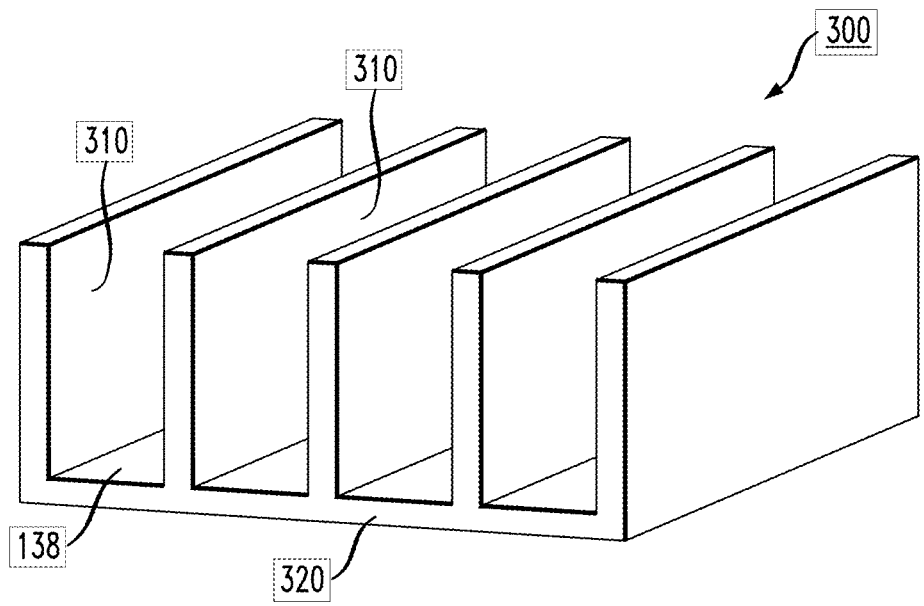
FIG. 32 is an isometric view of a portion of the second wafer of FIG. 31, showing the processing of the second wafer to create the sidewalls of the lid.

Continuing with the process, a second wafer 300 is processed, as shown in FIGS. 31 and 32, to form a plurality of structures 310 that will form portions of the side walls of lids 130. In this case, second wafer 300 is not completely etched through, where the remaining lower portion 320 of second wafer 300 will form ceiling 138 of lids 130. The view in FIG. 31 is looking "down" into second wafer 200. FIG. 32 is an isometric side view, taken along line 30-30 of FIG. 31.

Figure 33:
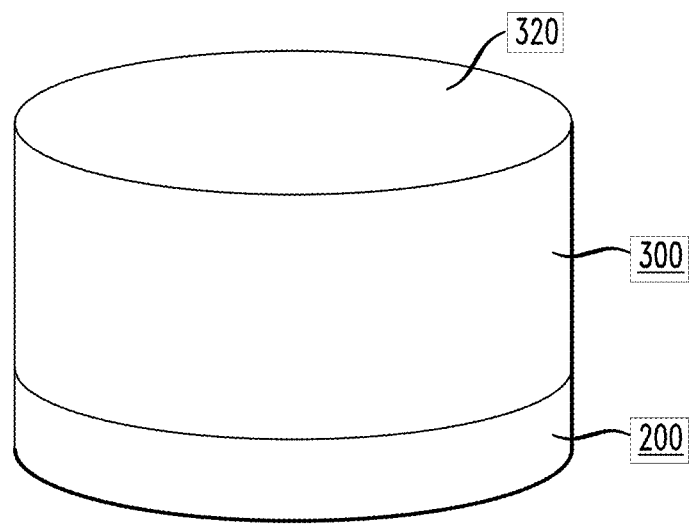
FIG. 33 shows the first and second wafers fused together subsequent to the processing as shown in FIGS. 30 and 31.
Figure 34:
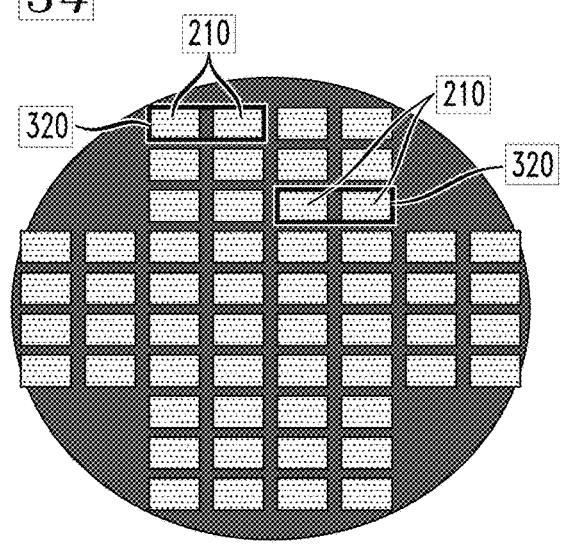
FIG. 34 is a top view of the fused structure, showing the overlapping of features as used to create the lid.
Figure 35:
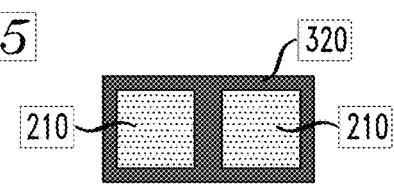
FIG. 35 is an illustration of a selected pair of lids as formed by the bonding of the first and second wafers.

In the following step, wafers 200 and 300 are fused together, forming the structure as shown in FIG. 33. FIG. 34 is a top view of the fused structure, showing a pair of bottom openings 210 as disposed over each lid structure 320 that had been formed in second wafer 300. FIG. 35 illustrates a view of a selected pair of lids from the wafer structure of FIG. 34.

Figure 36:
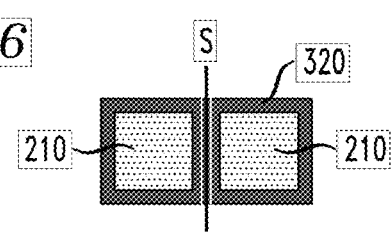
FIG. 36 illustrates the dicing operation used to separate the pair of lids of FIG. 35.
Figure 37:
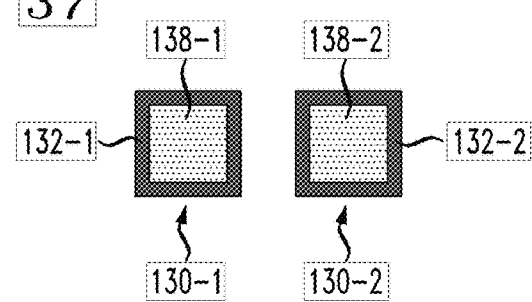
FIG. 37 shows the pair of separate lids formed from the dicing operation of FIG. 36.

FIG. 36 illustrates an exemplary step of dicing between the adjacent pair of lids of FIG. 35, forming a pair of separate lids 130-1 and 130-2, as shown in FIG. 37. The view depicted in FIGS. 35-37 is looking up through the bottom of lids 130, where FIG. 37 specifically identifies ceilings 138-1 and 138-2 of lids 130-1 and 130-2 (looking up at the underside of ceilings 138-1 and 138-2), as well as bottom surfaces 132-1 and 132-2. In accordance with this exemplary fabrication process, by virtue of forming structures 320 in wafer 300 that extend across the length of two top walls, the act of dicing the pair of adjacent lids apart (as shown in FIG. 36) creates this desired opening. As a result of this silicon fabrication process, the result is a wafer-scale fabrication of a plurality of module lids, such as module lid 130 shown in FIG. 29.

Laser Transmitter Module Assemblies

In accordance with various embodiments of the present invention, laser transmitter module 40 may be particularly configured to incorporate thermal management components. In particular, certain laser transmitter diodes generate a large amount of heat that would damage the laser's performance if not removed. In other configurations, temperature-based turning may be used to selective a specific wavelength to be used for a given transmitter module.

FIG. 38 is a side view of an exemplary laser transmitter module 40 formed in accordance with an exemplary embodiment of the present invention to manage thermal issues. In this side view, only a single laser diode 60 is shown. It is to be understood, however, and is evident from several of the other drawings, that an array of laser diodes is preferably encapsulated within the same structure.

As shown in FIG. 38, package substrate 20 is formed to include a metal insert 25, with silicon submount 62 disposed directly over and in direct contact with metal insert 25. Metal insert 25 is used to create a thermal path to direct heat generated by the array of laser diodes 60 away from the devices and into an underlying heat sink, not shown. Metal leads may also be formed along an end of metal insert 25 to provide interconnectivity between package substrate 20 and adjacent PCBs, such as PCB 12 (not shown). Also shown in FIG. 38 is an exemplary first fiber array connector 50, where first fiber array connector 50 is shown in passive alignment with fiber transmitter module 40 in FIG. 39.

The output radiation from laser diode array 60 is focused by lens 59 and passes through window 148 in module lid 130. The focused output radiation is thereafter directed into an associated optical fiber within fiber array 70 of first fiber array connector 50, which is described in detail above. FIG. 39 is a view with first fiber array connector 50 positioned in place so as to align with laser diode array 60. As shown in this particular configuration, end wall 61 of central recessed area 66 of silicon submount 62 contacts end wall 53 of first fiber array connector 50. The positioning of end termination 72-T of stripped end portion 72 of an exemplary optical fiber 70 in alignment with window 148 is also shown in FIG. 39.

Figure 40:
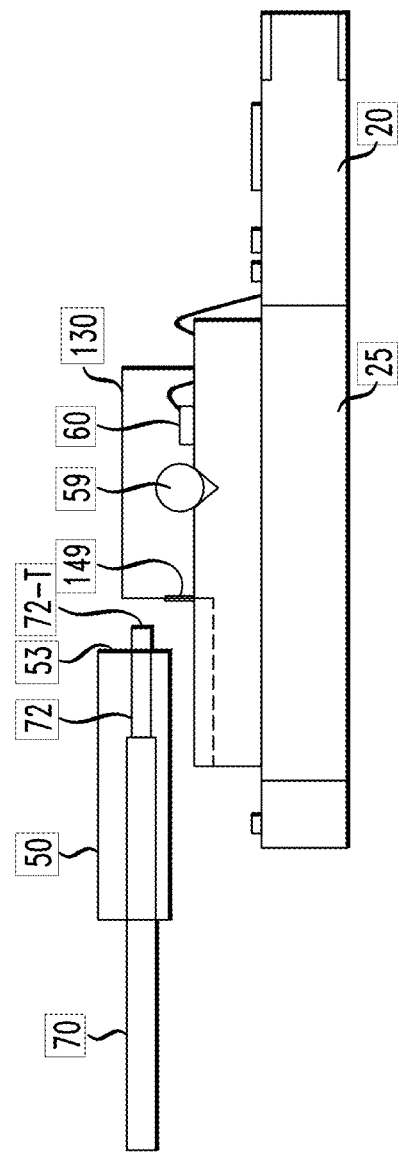
FIG. 40 is a side view of an alternative embodiment of a laser transmitter module, in this case illustrating a lid formed to include an opening for insertion of the fiber array into the encased area.
Figure 41:
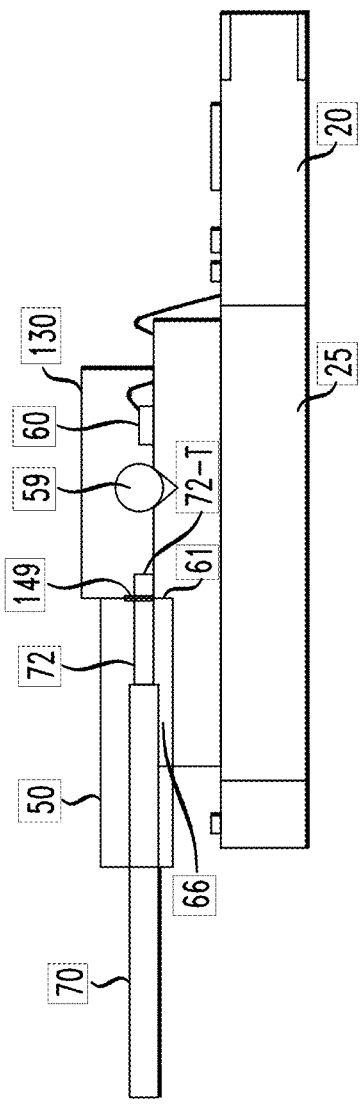
FIG. 41 shows the same laser transmitter module as illustrated in FIG. 40, in this case with an associated first fiber array connector disposed in place and illustrating the position of the fiber array underneath the lid

FIG. 40 is a side view of an exemplary laser engine 40 formed in accordance with a different embodiment of the present invention, also including a metal insert for heat transfer. In this embodiment, module lid 130 is formed to include door opening 149 (instead of a transparent window 148, as in FIGS. 38 and 39). Door opening 149 is utilized, as shown, to allow for end termination 72-T to enter laser transmitter module 40 and then be aligned with laser diode 60/lens 59. As also shown in FIG. 41, first fiber array connector 50 rests upon central recessed surface 66 formed within top surface 63 of silicon submount 62.

FIGS. 42 and 43 illustrate an alternative laser transmitter module 40 and associated first fiber array connector 50. In this configuration, an alternative passive optics arrangement is utilized, in particular in the form of a lens 150 (which may be a spherical lens (as in other embodiments), an aspheric lens, or any other appropriate configuration) in combination with an isolator 152. This particular arrangement utilizes window 148 to provide an optical signal path out of laser diodes 60. Isolator 152 is included to prevent reflections along the output path from re-entering laser diode 60. It is to be understood that in this configuration, as well as other laser transmitter modules, an array of isolators 152 (and lenses 150) are used in combination with an array of laser diodes as positioned within the laser transmitter module 40.

Also shown in this particular embodiment is an alternative configuration of a module lid, here referred to as module lid 130A that is formed to have a separate cover element 131 that is positioned over and bonded to module lid 130A once all components have been positioned within the housing. In embodiments where isolator 152 is used, it may simplify the assembly procedures to allow for the package to remain "open" so that the separate isolator and lens elements may be inserted. In another embodiment (not shown), where fiber end termination 72-T passes through door 149, the use of an "open" module 130A may be beneficial in simplifying the process of affixing the fiber in place.

In a variety of situations, it may necessary to further manage the thermal properties of laser transmitter module 40, particular in cases where it is desired to maintain the stability of the output wavelength from the laser diode array (or, conversely, to tune the emitted wavelength using a thermal process). For these situations, it may be desirable to utilize a thermo-electric cooler (TEC) in combination with metallic insert 25. FIG. 44 illustrates one such embodiment, where a TEC 174 is positioned underneath and in contact with metallic insert 25. TEC 174 is formed to include a pair of plates 176 and 178, with p-type and n-type semiconductor elements 180 disposed therebetween. An electrical lead coupled between package substrate 20 and plate 176 is used to provide an electrical input, defining plate 176 as the "cold" plate, regulating the temperature of laser diode array 60 in a manner well-known in the art.

FIG. 45 illustrates yet another configuration of a laser transmitter module 40 formed in accordance with the present invention. In this case, silicon submount 62 is shown as disposed on a silicon interposer 22, with silicon interposer 22 positioned on package substrate 20 (here, formed to include metal insert 25). As mentioned above, electrical connections through the stack of elements populating package substrate 20 may be provided by TSVs formed through the thicknesses of various elements. Here, a plurality of TSVs 23 are formed through silicon interposer 22, which are then electrically connected to (perhaps using surface contacts 25) package substrate 20. Advantageously, the presence of TSVs 23 providing additional thermal pathways to draw heat away from laser diodes 60, directing the heat into metal insert 25. As also shown in FIG. 45, package substrate 20 itself may comprise a plurality of TSVs 27 that thereafter contact selected locations on PCB 12, providing a pathway for electrical communication through PCB 12 to electrical edge connector 14, as shown on card 10 of FIG. 1.

Arrangements Using Multiple Interconnection Cards

It is to be understood that all of the features described above are useful in the formation of an interconnection card as a part of a larger system, indeed it is likely that high density, high bandwidth interconnection arrangements will likely use several of the interconnection cards as described above, providing different methods of communication between these cards.

Figure 46:
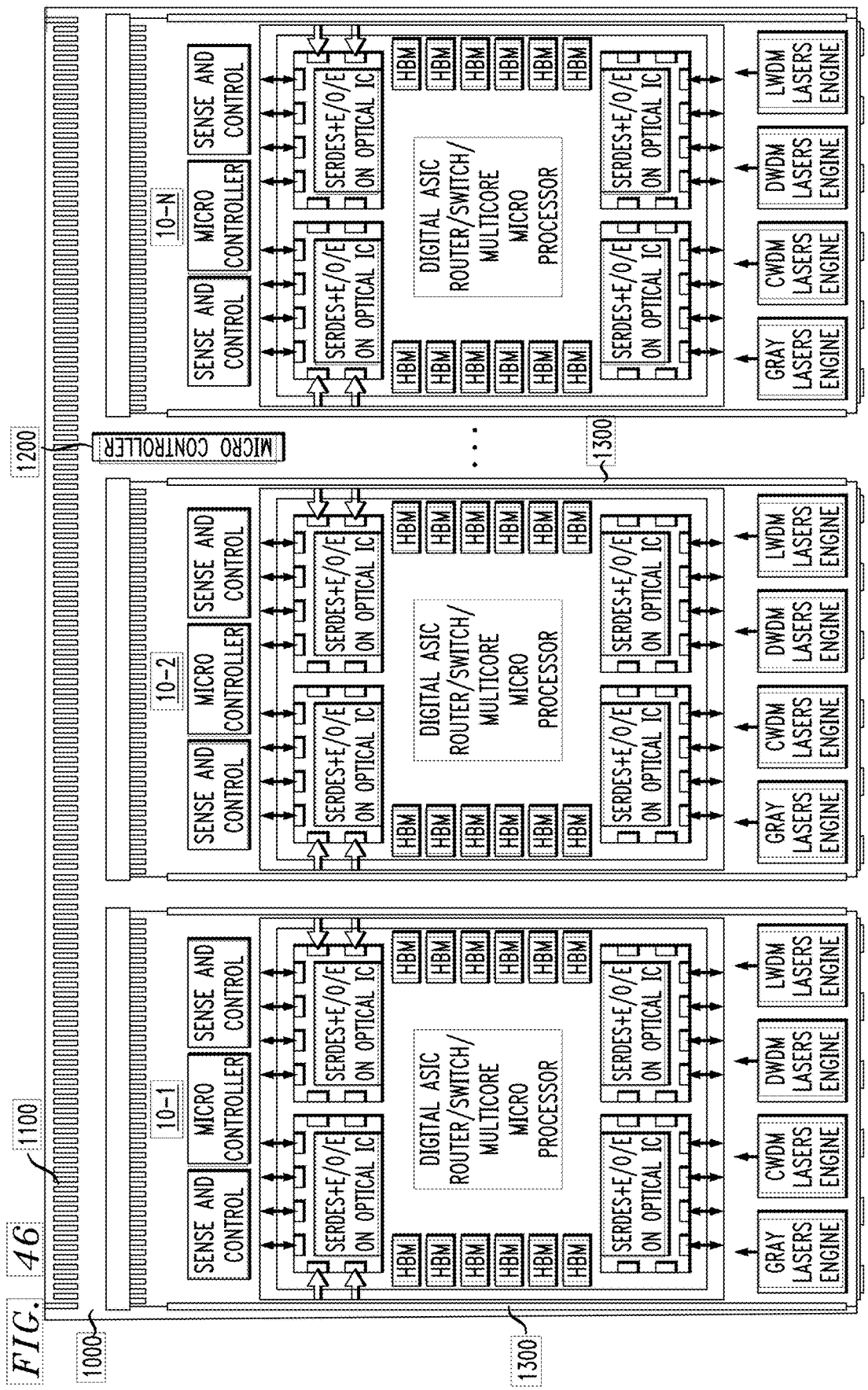
FIG. 46 illustrates an alternative embodiment of the present invention, utilizing a plurality of separate interconnection cards, all plugged in parallel into an associated motherboard.

For example, FIG. 46 illustrates a plurality of interconnection cards 10-1, 10-2, . . . , 10-N that are all connected in this case to a motherboard 1000. Motherboard 1000 is shown as comprising a plurality of pins 1100 for providing electrical connection to a backplane connector (not shown). Also included on motherboard 1000 is a micro-controller 1200, which is utilized to direct and control communication between associated equipment and the individual interconnection cards 10-1 through 10-N (interconnection cards 10 also referred to at times as "daughterboards" in such an arrangement). The physical design of this arrangement may include a plurality of guide rails 1300 to ensure that the daughterboards are properly positioned and held in place with respect to motherboard 1000.

Figure 47:
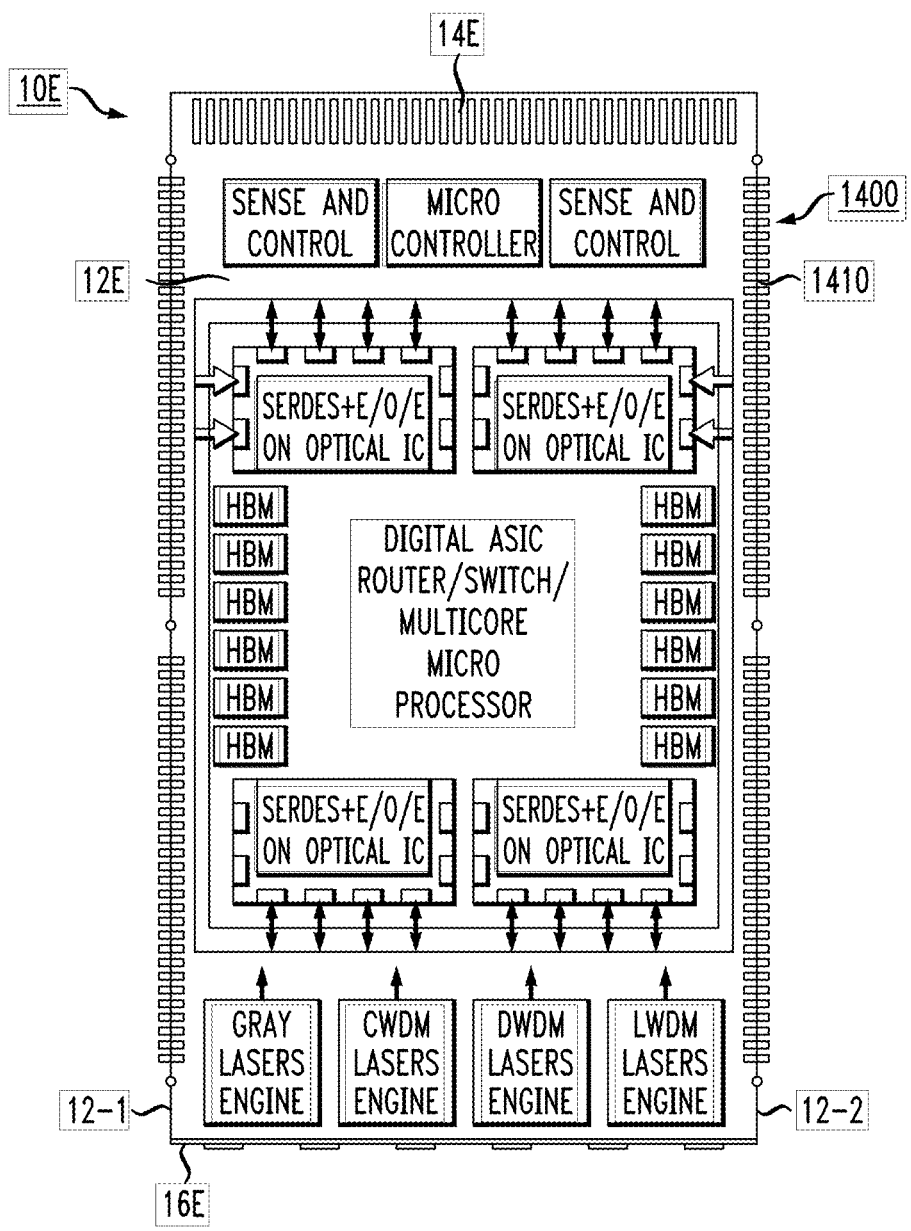
FIG. 47 shows an alternative embodiment of an interconnection card formed in accordance with the present invention, in this case including additional electrical edge connectors formed along side edges of the card.

FIG. 47 is a top view of an alternative embodiment of an interconnection card formed in accordance with the present invention, here referred to as "interconnection card 10E". As shown, card 10E includes similar components as included within interconnection card 10(10A) shown in FIG. 1(3). For the sake of simplicity, the numerals are not included on this view and the operations of the specific components are not discussed. The additional feature as shown in interconnection card 10E is an electrical connector 1400 (comprising a plurality of pins 1410) formed along opposing side edges 12-1 and 12-2 of PCB 12E. In accordance with one or more embodiments of the present invention, electrical connectors 1400 may be used to provide direct electrical communication between adjacent daughterboards.

Figure 48:
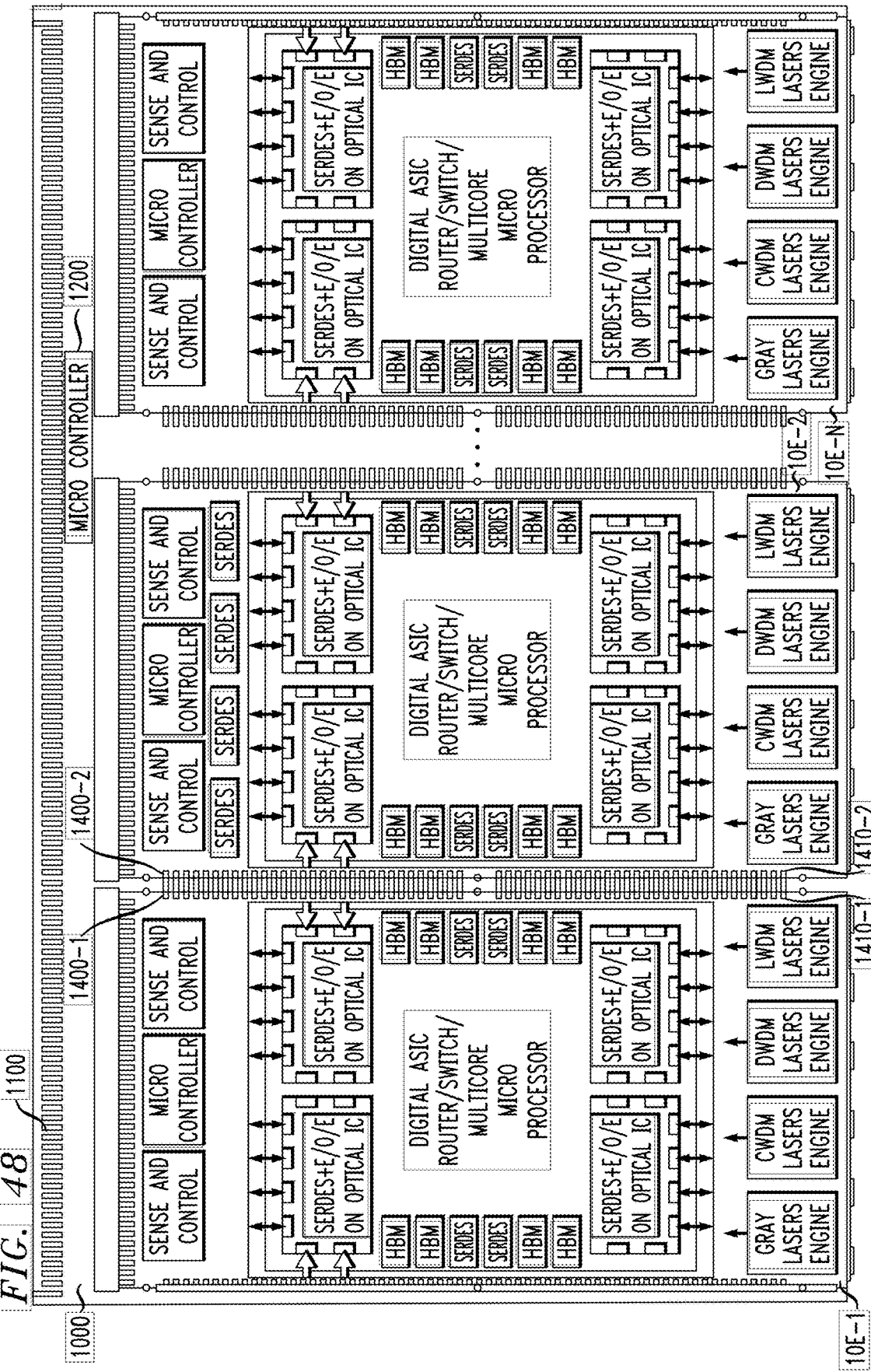
FIG. 48 illustrates an exemplary interconnection between multiple edge connectors, based on the interconnection card as shown in FIG. 47.

FIG. 48 illustrates this concept. Here, a first interconnection card 10E-1 and a second interconnection card 10E-2 are disposed side-by-side, with pins 1410 of electrical connector 1400-1 (of card 10E-1) coupled to pins 1410 of electrical connector 1400-2 (of card 10E-2). In accordance with this embodiment of the present invention, therefore, electrical communications between these adjacent daughter cards may pass between the connected side edges and bypass motherboard 1000. Inasmuch as the information from one daughter card does not need to first be communicated to the motherboard, which then functions to direct the information back to the adjacent motherboard, this configuration of the present invention provides an increase in both speed and efficiency of communication between adjacent daughter cards.

In the preceding, reference is made to embodiments presented in this disclosure. However, the scope of the present invention is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limited of the scope of the present invention. Thus, the preceding aspects, features, embodiments and advantages are merely illustrative and are not considered elements or limitations of the appended claims except where explicitly recited in a claim.

What is claimed is:

1. An interconnection card for providing a switching and routing interface between optical and electrical communication signals, the interconnector card comprising:
   a card substrate;
   an electrical edge connector formed along a first end termination of the card substrate;
   an optical connector formed along an opposing, second end termination of the card substrate;
   electrical routing and switching circuitry disposed on the card substrate;
   a package substrate disposed on the card substrate;

a silicon photonic integrated circuit (PIC) disposed on the package substrate and used to provide conversion between optical input signals and electrical output signals, the silicon PIC formed to include alignment channels around selected peripheral locations and etch regions for holding bonding material;

at least one laser transmitter module disposed on the card substrate, the laser transmitter module including a silicon submount upon which an array of laser diodes is located, the silicon submount patterned and etched to form alignment rails; and a plurality of passively-aligned optical fiber array connectors coupled between the at least one laser transmitter module and the silicon PIC, the plurality of passively-aligned optical fiber array connectors including a first fiber array connector disposed in alignment with an array of laser diodes within the at least one laser transmitter module, the first fiber array connector including a silicon substrate patterned and etched to form fiber-holding V-grooves and alignment trenches for mating with the silicon submount alignment rails to provide passive alignment between an array of optical fibers and the laser diode array; and a second fiber array connector disposed in alignment with an array of optical waveguides formed within a portion of the silicon PIC and terminating along an endface, the second fiber array connector including a silicon substrate patterned and etched to form fiber-holding V-grooves and alignment rails for mating with the alignment channels formed in the silicon PIC, wherein a first array of optical fibers is disposed between the first fiber array connector and the second fiber array connector to provide optical communication between the at least one laser transmitter module and the silicon PIC; and a third fiber array connector disposed in alignment with an array of optical waveguides formed within a separation portion of the silicon PIC and terminating along an endface, the third fiber array connector including a silicon substrate patterned and etched to form fiber-holding V-grooves and alignment rails for mating with selected alignment channels formed in the silicon PIC, wherein a second array of optical fibers is disposed between the third fiber array connector and the optical connector positioned on the interconnection card, to provide optical communication into and out of the interconnection card.

2. The interconnection card as defined in claim 1 wherein the silicon PIC comprises a plurality of separate silicon PIC components.

3. The interconnection card as defined in claim 2 wherein the interconnection card further comprises a silicon interposer disposed at an interface between the package substrate and the plurality of separate silicon PIC components.

4. The interconnection card as defined in claim 3 wherein the electrical routing and switching circuitry is disposed on the silicon interposer with the plurality of separate silicon PIC components.

5. The interconnection card as defined in claim 2 wherein the package substrate comprises a plurality of separate package substrate components, with a separate silicon PIC component disposed on a separate one of the package substrate components.

6. The interconnection card as defined in claim 5 wherein a separate silicon interposer is disposed between each associated package substrate component and silicon PIC component.

7. The interconnection card as defined in claim 1 wherein the first and second fiber array connectors are configured to support an array of polarization-maintaining optical fiber.

8. The interconnection card as defined in claim 1 wherein the third fiber array connector is configured to support an array of single mode optical fiber.

9. The interconnection card as defined in claim 1 wherein the first fiber array connector is configured to support a plurality of lenses in alignment with the plurality of optical fibers.

10. The interconnection card as defined in claim 1 wherein the at least one laser transmitter module comprises a plurality of separate laser transmitter modules, each separate laser transmitter module having a separate first fiber array connector coupled thereto.

11. The interconnection card as defined in claim 1 wherein the at least one laser transmitter module further comprises a lid component disposed over the plurality of laser diodes.

12. The interconnection card as defined in claim 1 wherein the at least one laser transmitter module further comprises a plurality of lenses disposed in optical alignment with the plurality of laser diodes.

13. The interconnection card as defined in claim 1 wherein the at least one laser transmitter module further comprises a metal insert disposed within the package substrate for providing heat transfer away from the plurality of laser diodes.

14. The interconnection card as defined in claim 1 wherein the interconnection card further comprises
an electrical edge connector disposed along at least one side each of the card substrate.

15. The interconnection card as defined in claim 1 wherein the card substrate comprises a printed circuit board.

16. A high density interconnection configuration for providing a high bandwidth of electrical signals between a motherboard and a plurality of interconnection daughter cards, each interconnection daughter card comprising
a card substrate;
an electrical edge connector formed along a first end termination of the card substrate;
an optical connector formed along an opposing, second end termination of the card substrate;
electrical routing and switching circuitry disposed on the card substrate;
a package substrate disposed on the card substrate;
a silicon photonic integrated circuit (PIC) disposed on the package substrate and used to provide conversion between optical input signals and electrical output signals, the silicon PIC formed to include alignment channels around selected peripheral locations and etch regions for holding bonding material;
at least one laser transmitter module disposed on the card substrate, the laser transmitter module including a silicon submount upon which an array of laser diodes is located, the silicon submount patterned and etched to form alignment rails; and
a plurality of passively-aligned optical fiber array connectors coupled between the at least one laser transmitter module and the silicon PIC, the plurality of passively-aligned optical fiber array connectors including
a first fiber array connector disposed in alignment with an array of laser diodes within the at least one laser transmitter module, the first fiber array connector including a silicon substrate patterned and etched to form fiber-holding V-grooves and alignment trenches for mating with the silicon submount alignment rails to provide passive alignment between an array of optical fibers and the laser diode array; and a second fiber array connector disposed in alignment with an array of optical waveguides formed within a portion of the silicon PIC and terminating along an endface, the second fiber array connector including a silicon substrate patterned and etched to form fiber-holding V-grooves and alignment rails for mating with the alignment channels formed in the silicon PIC, wherein a first array of optical fibers is disposed between the first fiber array connector and the second fiber array connector to provide optical communication between the at least one laser transmitter module and the silicon PIC; and a third fiber array connector disposed in alignment with an array of optical waveguides formed within a separation portion of the silicon PIC and terminating along an endface, the third fiber array connector including a silicon substrate patterned and etched to form fiber-holding V-grooves and alignment rails for mating with selected alignment channels formed in the silicon PIC, wherein a second array of optical fibers is disposed between the third fiber array connector and the optical connector positioned on the interconnection card, to provide optical communication into and out of the interconnection card.

17. The interconnection configuration as defined in claim 16 wherein at least a pair of interconnection cards includes additional electrical edge connectors formed along side edges thereof and interconnected between a first card of the pair of interconnection cards and a second card of the pair of interconnection cards such that the pair of interconnection cards provides direct communication therebetween and bypasses the motherboard connection.

* * * * *